US012764993B2

(12) United States Patent
Chen et al.

(10) Patent No.: US 12,764,993 B2
(45) Date of Patent: Oct. 13, 2026

(54) HIGH VOLTAGE TRANSISTOR STRUCTURE

(71) Applicant: Taiwan Semiconductor Manufacturing Co., Ltd., Hsinchu (TW)

(72) Inventors: Po-Yu Chen, Baoshan Township (TW); Wan-Hua Huang, Hsinchu (TW); Jing-Ying Chen, Taipei (TW); Kuo-Ming Wu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 407 days.

(21) Appl. No.: 18/441,118

(22) Filed: Feb. 14, 2024

(65) Prior Publication Data

US 2024/0186412 A1 Jun. 6, 2024

Related U.S. Application Data

(63) Continuation of application No. 17/408,846, filed on Aug. 23, 2021, now Pat. No. 11,935,950, which is a (Continued)

(51) Int. Cl.
*H10D 30/60* (2025.01)
*H10D 30/01* (2025.01)
(Continued)

(52) U.S. Cl.
CPC ....... *H10D 30/603* (2025.01); *H10D 30/0221* (2025.01); *H10D 30/0281* (2025.01); (Continued)

(58) Field of Classification Search
CPC ............ H10D 30/603; H10D 30/0281; H10D 30/0221
See application file for complete search history.

(56) References Cited

U.S. PATENT DOCUMENTS 4,574,208 A 3/1986 Lade et al.
6,855,985 B2 2/2005 Williams et al.
(Continued)

FOREIGN PATENT DOCUMENTS

CN 101339945 A 1/2009
CN 101350351 A 1/2009
(Continued)

*Primary Examiner* — Suberr L Chi
(74) *Attorney, Agent, or Firm* — Slater Matsil, LLP

(57) ABSTRACT

A device includes a first buried layer over a substrate, a second buried layer over the first buried layer, a first well over the first buried layer and the second buried layer, a first high voltage well, a second high voltage well and a third high voltage well extending through the first well, wherein the second high voltage well is between the first high voltage well and the third high voltage well, a first drain/source region in the first high voltage well, a first gate electrode over the first well, a second drain/source region in the second high voltage well and a first isolation region in the second high voltage well, and between the second drain/source region and the first gate electrode, wherein a bottom of the first isolation region is lower than a bottom of the second drain/source region.

20 Claims, 36 Drawing Sheets

Related U.S. Application Data continuation of application No. 16/373,959, filed on Apr. 3, 2019, now Pat. No. 11,107,916, which is a continuation of application No. 15/728,740, filed on Oct. 10, 2017, now Pat. No. 10,269,959, which is a continuation of application No. 13/772,115, filed on Feb. 20, 2013, now Pat. No. 9,799,766.

(51) Int. Cl.

| | |
|---|---|
| *H10D 62/10* | (2025.01) |
| *H10D 62/17* | (2025.01) |
| *H10D 62/83* | (2025.01) |
| *H10D 64/62* | (2025.01) |
| *H10D 64/66* | (2025.01) |

(52) U.S. Cl.

CPC ....... *H10D 30/0212* (2025.01); *H10D 62/116* (2025.01); *H10D 62/378* (2025.01); *H10D 62/83* (2025.01); *H10D 64/62* (2025.01); *H10D 64/663* (2025.01)

(56) References Cited

U.S. PATENT DOCUMENTS

| | | | | |
|---|---|---|---|---|
| 7,109,562 | B2 | 9/2006 | Lee | |
| 7,683,426 | B2 | 3/2010 | Williams et al. | |
| 7,683,453 | B2 | 3/2010 | Williams et al. | |
| 7,719,054 | B2 | 5/2010 | Williams et al. | |
| 7,843,002 | B2 | 11/2010 | Wei et al. | |
| 8,022,446 | B2 | 9/2011 | Huang et al. | |
| 8,236,642 | B2 | 8/2012 | Wei et al. | |
| 8,349,678 | B2 | 1/2013 | Chuang et al. | |
| 8,546,879 | B2 | 10/2013 | Disney et al. | |
| 11,107,916 | B2 * | 8/2021 | Chen | H10D 30/603 |
| 2002/0053685 | A1 | 5/2002 | Pendharkar et al. | |
| 2006/0261378 | A1 | 11/2006 | Moscatelli et al. | |
| 2007/0075363 | A1 | 4/2007 | Otake et al. | |
| 2007/0122986 | A1 | 5/2007 | Sandhu | |
| 2007/0126057 | A1 | 6/2007 | Liu et al. | |
| 2007/0264785 | A1 * | 11/2007 | Choi | H01L 29/7816 257/E29.066 |
| 2008/0061400 | A1 | 3/2008 | Williams et al. | |
| 2008/0197408 | A1 | 8/2008 | Disney et al. | |
| 2009/0159968 | A1 | 6/2009 | Merchant et al. | |
| 2009/0267145 | A1 | 10/2009 | Pearce et al. | |
| 2010/0163983 | A1 | 7/2010 | Choi | |
| 2011/0039387 | A1 | 2/2011 | Wei et al. | |
| 2011/0115020 | A1 | 5/2011 | Cha et al. | |
| 2012/0187483 | A1 | 7/2012 | Yang et al. | |
| 2012/0286359 | A1 | 11/2012 | Lin et al. | |
| 2013/0334600 | A1 | 12/2013 | Hsu et al. | |

FOREIGN PATENT DOCUMENTS

| | | | |
|---|---|---|---|
| CN | 101542697 | A | 9/2009 |
| CN | 102148162 | A | 8/2011 |
| CN | 102386227 | A | 3/2012 |

* cited by examiner

HIGH VOLTAGE TRANSISTOR STRUCTURE

CROSS-REFERENCE TO RELATED APPLICATIONS

This application is a continuation of U.S. application Ser. No. 17/408,846, entitled "High Voltage Transistor Structure and Method," filed on Aug. 23, 2021, which is a continuation of U.S. application Ser. No. 16/373,959, entitled "High Voltage Transistor Structure and Method," filed on Apr. 3, 2019, now U.S. Pat. No. 11,107,916 issued Aug. 31, 2021, which is a continuation of U.S. application Ser. No. 15/728,740, entitled "High Voltage Transistor Structure and Method," filed on Oct. 10, 2017, now U.S. Pat. No. 10,269,959 issued Apr. 23, 2019, which is a continuation of U.S. application Ser. No. 13/772,115, entitled "High Voltage Transistor Structure and Method," filed on Feb. 20, 2013, now U.S. Pat. No. 9,799,766 issued Oct. 24, 2017, each application is hereby incorporated herein by reference.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As semiconductor devices are scaled down, new techniques are needed to maintain the electronic components' performance from one generation to the next.

As semiconductor technologies evolve, metal oxide semiconductor (MOS) transistors have been widely used in today's integrated circuits. MOS transistors are voltage controlled device. When a control voltage is applied to the gate a MOS transistor and the control voltage is greater than the threshold of the MOS transistor, a conductive channel is established between the drain and the source of the MOS transistor. As a result, a current flows between the drain and the source of the MOS transistor. On the other hand, when the control voltage is less than the threshold of the MOS transistor, the MOS transistor is turned off accordingly.

MOS transistors may include two major categories. One is n-channel MOS transistors; the other is p-channel MOS transistors. According to the structure difference, MOS transistors can be further divided into three sub-categories, planar MOS transistors, lateral double diffused MOS transistors and vertical double diffused MOS transistors.

As semiconductor technologies further advance, new power MOS devices have emerged to further improve key performance characteristics such as voltage rating, power handling capability and reliability. The new power MOS devices may include laterally diffused MOS (LDMOS) transistors, double diffused MOS (DMOS) transistors, extended drain MOS (EDMOS) transistors, double diffused drain MOS (DDDMOS) transistors and the like.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, an asymmetric p-type double-diffused metal oxide semiconductor (DMOS) transistor. The embodiments of the disclosure may also be applied, however, to a variety of high voltage MOS transistors. Hereinafter, various embodiments will be explained in detail with reference to the accompanying drawings.

Figure 1:
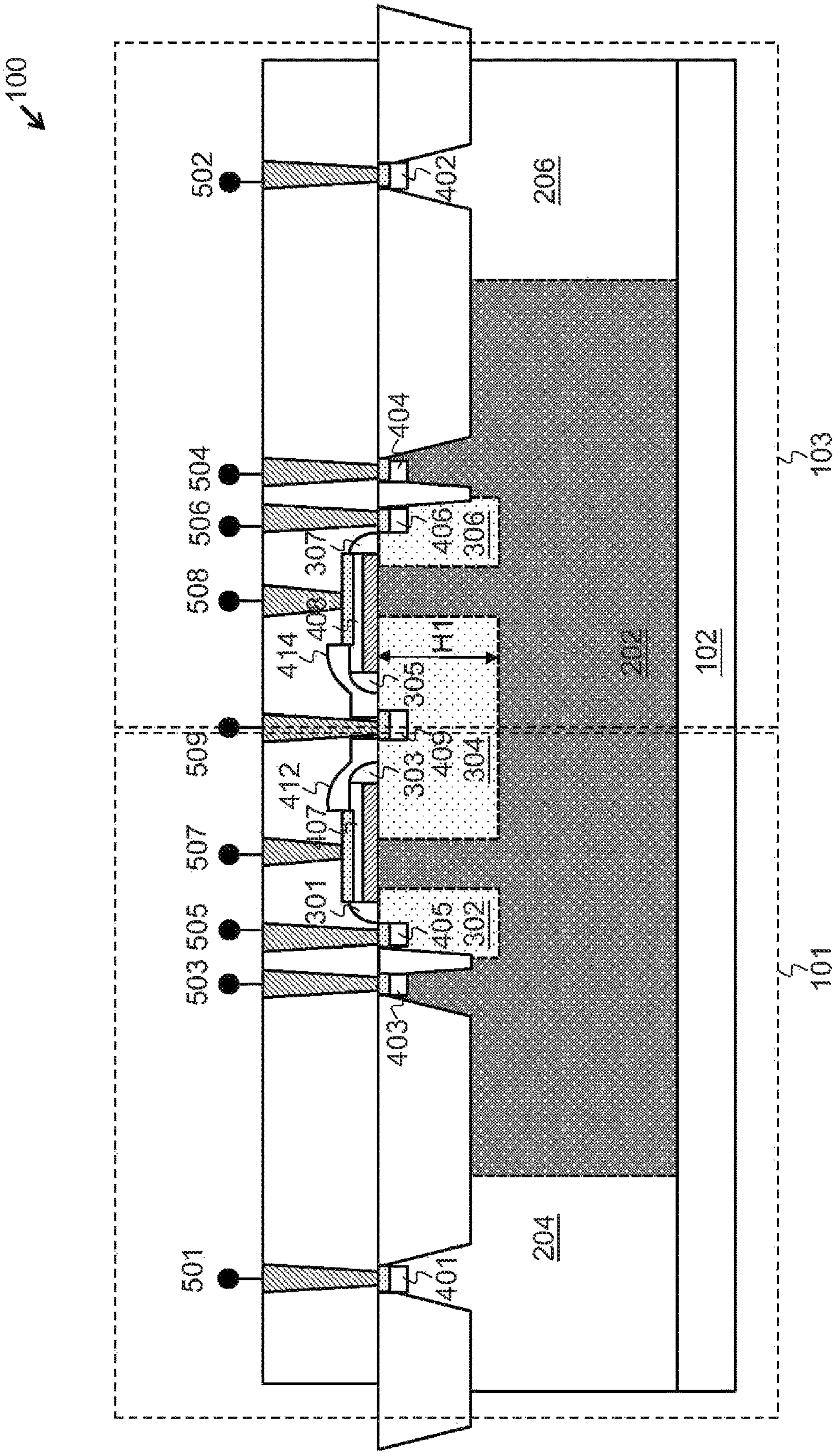
FIG. 1 illustrates a simplified cross-sectional view of an asymmetric p-type DMOS transistor in accordance with various embodiments of the present disclosure.

FIG. 1 illustrates a simplified cross-sectional view of an asymmetric p-type DMOS transistor in accordance with various embodiments of the present disclosure. The asymmetric p-type DMOS transistor 100 comprises two p-type DMOS transistors sharing a common drain 409. A first p-type DMOS transistor 101 comprises a first gate 407 and its contact 507, the drain 409 and its contact 509, a first source 405 and its contact 505.

As shown in FIG. 1, a first spacer 301 is formed on one side of the first gate 407. A second spacer 303 is formed on an opposite side of the first gate 407. The first source 405 and the first gate 407 are separated by the first spacer 301. The drain 409 and the first gate 407 are separated by the second spacer 303 and a first oxide layer 412 formed between the second spacer 303 and the drain 409. In some embodiments, the first oxide layer 412 is a protection dielectric layer. As shown in FIG. 1, the first oxide layer 412 is employed to cover a portion of the top surface of the first gate 407 and a portion of the top surface of a second PDD region 304 so as to prevent silicide formation at the first gate 407.

A second p-type DMOS transistor 103 comprises a second gate 408 and its contact 508, the drain 409 and its contact 509, a second source 406 and its contact 506. The second p-type DMOS transistor 103 is of a same structure as the first p-type DMOS transistor 101, and hence is not discussed in detail herein to avoid repetition.

The drain and source regions 405, 406 and 409 described above are formed in p-type double diffused (PDD) regions. In particular, the first source 405 is formed in a first PDD region 302. The drain 409 is formed in a second PDD region 304. The second source 406 is formed in a third PDD region 306. The PDD regions 302, 304 and 306 are formed in a high voltage n-type well (HVNW) region 202. The HVNW region 202 is formed in a substrate 102.

In accordance with some embodiments, the first PDD region 302 and the third PDD region 306 may function as a lightly doped diffusion (LDD) region. The first PDD region 302 and the third PDD region 306 are formed near the gate/source edge and helps to lower the electric field so that the MOS transistor is able to handler higher voltages. The second PDD region 304 may function as a diffusion region.

One advantageous feature of the PDD regions (e.g., PDD 302) shown in FIG. 1 is that by employing PDD regions 302 and 306 to replace conventional LDD regions, the extra masks for fabricating LDD regions can be saved. As a result, the cost as well as the reliability of the asymmetric p-type DMOS transistor 100 shown in FIG. 1 can be improved.

The asymmetric p-type DMOS transistor 100 may further comprise a first p-type well (PW) region 204 and a second PW region 206. Both PW regions 204 and 206 are formed over the substrate 102. FIG. 1 further illustrates there may be a first substrate contact region 401 having p-type dopants and its terminal 501 coupled to the first PW region 204 and a second substrate contact region 402 having p-type dopants and its terminal 502. The substrate contact regions may be further coupled to ground so that the body effect can be avoided. Moreover, the asymmetric p-type DMOS transistor 100 may further comprise a first well contact region 403 having n-type dopants and its terminal 503, and a second well contact region 404 having n-type dopants and its terminal 504. Both well contact regions are coupled to the HVNW 202. It should be noted that the terminals 503 and 504 are commonly known as the bulk contacts of the asymmetric p-type DMOS transistor 100.

As shown in FIG. 1, the drain and source regions of the asymmetric p-type DMOS transistor 100 are formed in the PDD regions. The PDD regions 302, 304 and 306 are of a same ion implantation depth. The ion implantation depth of the PDD regions is defined as H1 as shown in FIG. 1. In accordance with some embodiments, H1 is in a range from about 0.2 um to about 4 um.

One skilled in the art will recognize that FIG. 1 illustrates an ideal profile. The dimensions of the PDD regions may vary after subsequent fabrication processes. H1 shown in FIG. 1 is used to illustrate the inventive aspects of the various embodiments. The disclosure is not limited to any particular dimensions of the PDD regions.

The asymmetric p-type DMOS transistor 100 may further comprise a plurality of silicide regions over drain, source and gate regions. The detailed fabrication process of the structures above will be described below with respect to FIGS. 2-15.

FIGS. 2-15 illustrate cross section views of intermediate steps of fabricating the asymmetric p-type DMOS transistor shown in FIG. 1 in accordance with various embodiments of the present disclosure.

Figure 2:
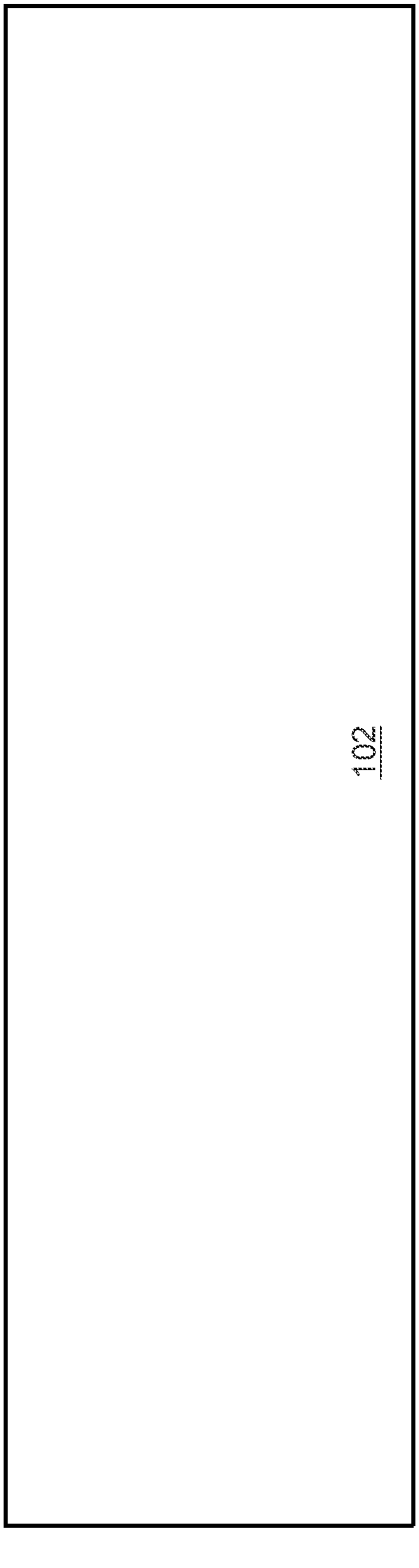
FIGS. 2-15 illustrate cross section views of intermediate steps of fabricating the asymmetric p-type DMOS transistor shown in FIG. 1 in accordance with various embodiments of the present disclosure.

FIG. 2 illustrates a cross section view of a substrate in accordance with various embodiments of the present disclosure. The substrate 102 is formed of silicon, although it may also be formed of other group III, group IV, and/or group V elements, such as silicon, germanium, gallium, arsenic, and combinations thereof.

As is known to those of skill in the art, the use of dopant atoms in an implant step may form the substrate 102 with a particular conductivity type. Depending on different applications, the substrate 102 may be n-type or p-type. In some embodiments, the substrate 102 is a p-type substrate. Appropriate p-type dopants such as boron, gallium, indium and/or the like are implanted into the substrate 102. Alternatively, the substrate 102 is an n-type substrate. Appropriate n-type dopants such as phosphorous, arsenic and/or the like are implanted into the substrate 102. In embodiments shown in FIGS. 2-15, the substrate 102 is a p-type substrate.

Figure 3:
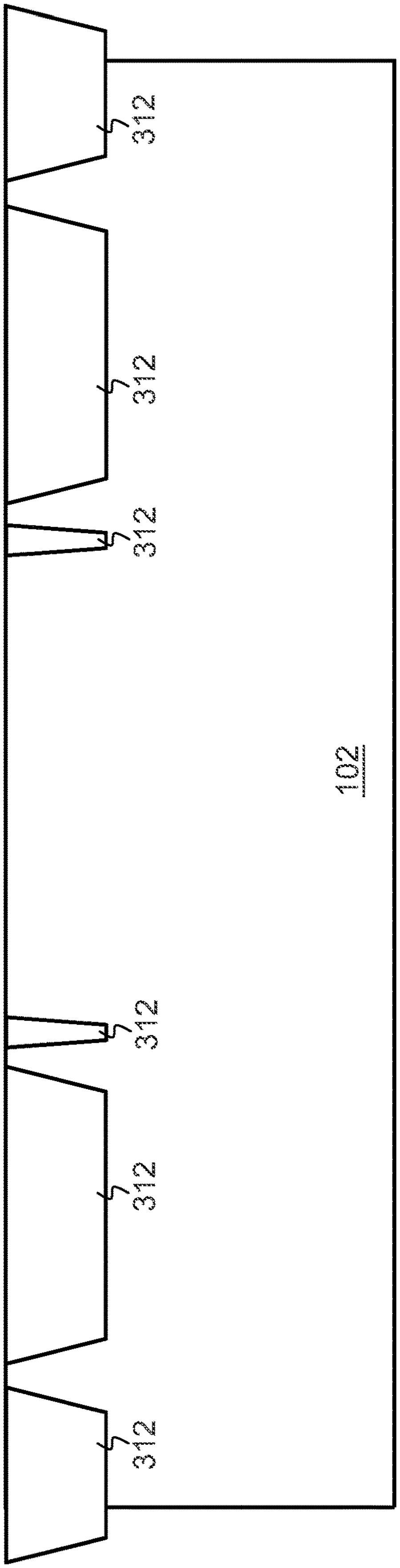

FIG. 3 illustrates a cross section view of the substrate shown in FIG. 2 after a plurality of isolation regions are formed in the substrate in accordance with various embodiments of the present disclosure. The isolation regions 312 may be shallow trench isolation (STI) regions, and may be formed by etching the substrate 102 to form a trench and filling the trench with a dielectric material as is known in the art. For example, the isolation regions 312 may be filled with a dielectric material such as an oxide material, a high-density plasma (HDP) oxide and/or the like. The dielectric materials are formed using suitable semiconductor deposition techniques such as chemical vapor deposition (CVD) and/or the like.

A planarization process such as a chemical mechanical planarization (CMP) process may be applied to the top surface of the substrate 102 so that the excess dielectric material may be removed as a result. In a CMP process, a combination of etching materials and abrading materials are put into contact with the top surface of the substrate 102 and a grinding pad (not shown) is used to grind away the excess dielectric material formed on top of the substrate 102 until the top surface of the substrate 102 is exposed.

Figure 4:
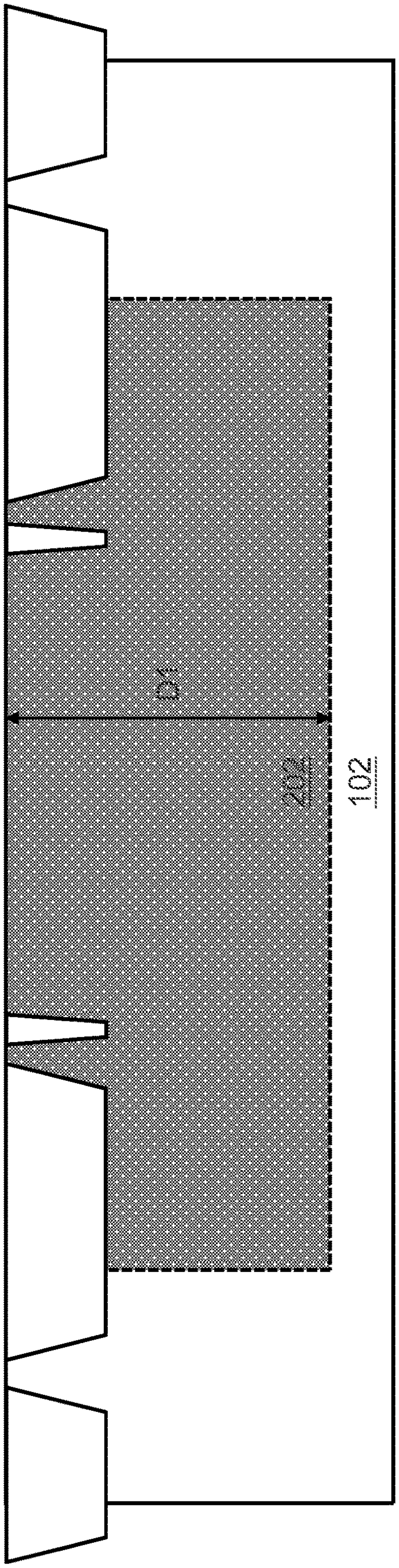

FIG. 4 illustrates a cross section view of the semiconductor device shown in FIG. 3 after an ion implantation process is applied to the substrate in accordance with various embodiments of the present disclosure. A high voltage n-type well (HVNW) region 202 is formed through suitable semiconductor doping techniques such as an ion implantation process. In some embodiments, appropriate n-type dopants such as phosphorous, arsenic and/or the like are implanted into the substrate 102 to form the HVNW region 202.

In some embodiments, the doping concentration of the HVNW region 202 is in a range from about $1\times10^{15}/cm^3$ to about $1\times10^{18}/cm^3$. By controlling the ion implantation energy, the dopants may penetrate through the top surface of the substrate 202 as well as the isolation regions 312. The depth of the HVNW region 202 may be adjusted accordingly. In some embodiments, the depth as shown in FIG. 4 is defined as D1, which is in a range from about 2 um to about 5 um.

Figure 5:
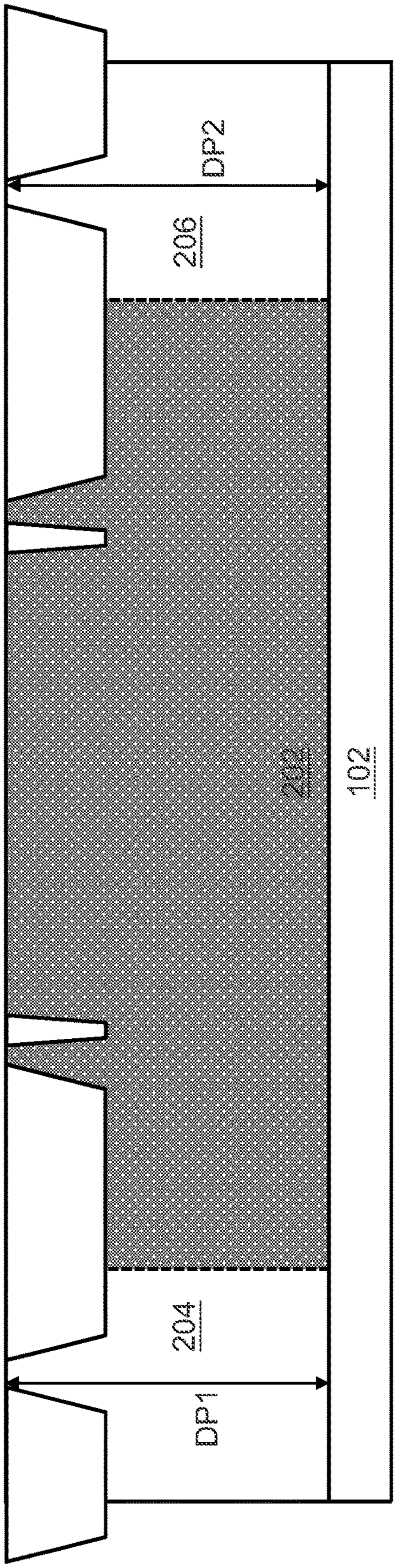

FIG. 5 illustrates a cross section view of the semiconductor device shown in FIG. 4 after another ion implantation process is applied to the substrate in accordance with various embodiments of the present disclosure. A first p-type well (PW) region 204 and a second PW region 206 are formed through suitable semiconductor doping techniques such as an ion implantation process. In some embodiments, appropriate p-type dopants such as boron, gallium, indium and/or the like are implanted into the substrate 102 to form the first PW region 204 and the second PW region 206. As shown in FIG. 5, the first PW region 204 is formed on one side of the HVNW 202. The second PW region 206 is formed on an opposite side of the HVNW 202 from the first PW region 204.

In some embodiments, the doping concentration of the first PW region 204 and the second PW region 206 is in a range from about $1\times10^{15}/cm^3$ to about $1\times10^{18}/cm^3$. By controlling the ion implantation energy, the depths of the first PW region 204 and the second PW region 206 may be adjusted accordingly. In some embodiments, as shown in FIG. 5 the depths of the first PW region 204 and the second PW region 206 are defined as DP1 and DP2 respectively, which are in a range from about 0.4 um to about 5 um.

Figure 6:
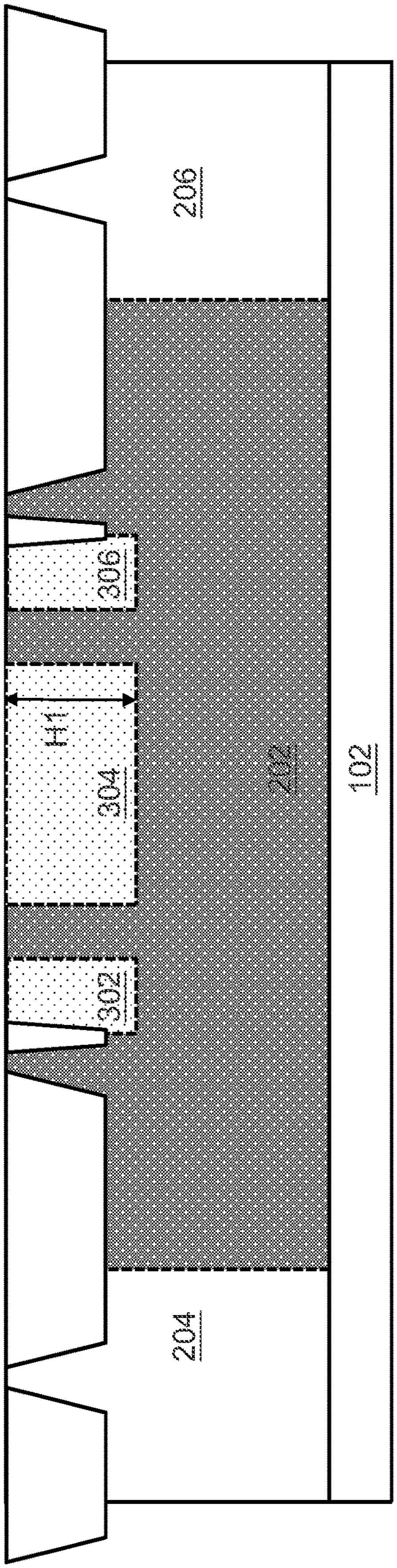

FIG. 6 illustrates a cross section view of the semiconductor device shown in FIG. 5 after an ion implantation process is applied to the HVNW region in accordance with various embodiments of the present disclosure. A first PDD region 302, a second PDD region 304 and a third PDD region 306 are formed through suitable semiconductor doping techniques such as an ion implantation process. In some embodiments, appropriate p-type dopants such as boron, gallium, indium and/or the like are implanted into the HVNW region 202 to form the first PDD region 302, a second PDD region 304 and a third PDD region 306. As shown in FIG. 6, the second PDD region 304 is formed between the first PDD region 302 and the third PDD region 306.

In some embodiments, the doping concentration of the first PDD region 302, a second PDD region 304 and a third PDD region 306 is in a range from about $1\times10^{15}/cm^3$ to about $1\times10^{18}/cm^3$. By controlling the ion implantation energy, the depths of first PDD region 302, a second PDD region 304 and a third PDD region 306 may be adjusted accordingly. In some embodiments, as shown in FIG. 6 the depths of the first PDD region 302, a second PDD region 304 and a third PDD region 306 are defined as H1. H1 is in a range from about 0.2 um to about 4 um.

Figure 7:
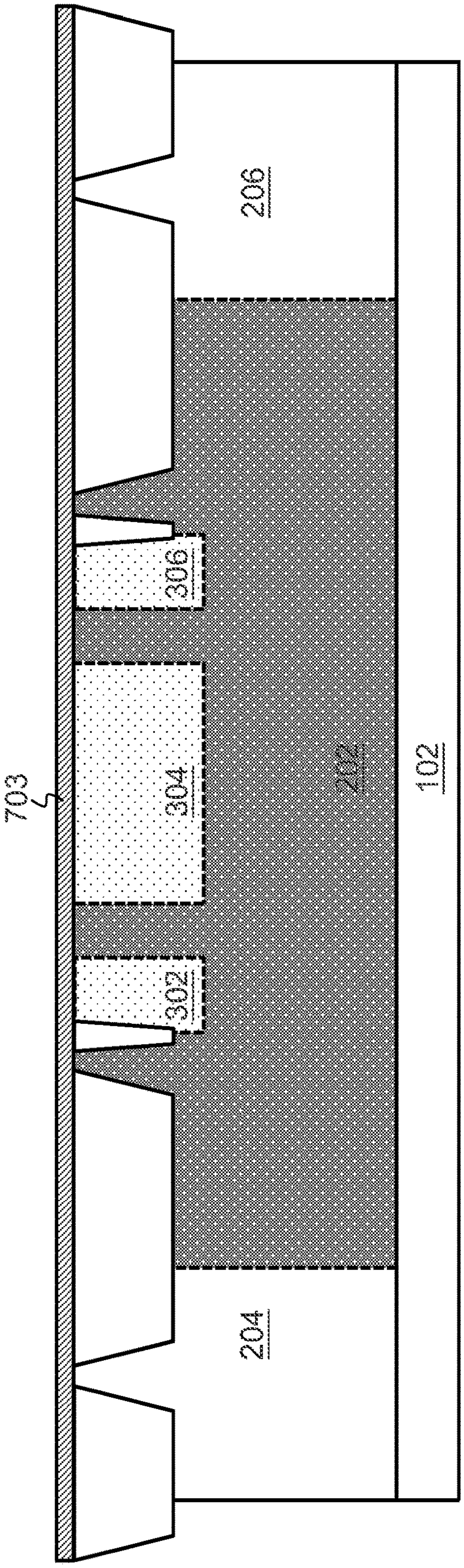

FIG. 7 illustrates a cross section view of the semiconductor device shown in FIG. 6 after a gate dielectric layer is formed over the substrate in accordance with various embodiments of the present disclosure. The gate dielectric layers 703 is formed on the top surface of the semiconductor device.

The gate dielectric layer 703 may be formed of a dielectric material such as silicon oxide, silicon oxynitride, silicon nitride, an oxide, a nitrogen-containing oxide, a combination thereof and/or the like. The gate dielectric layer 703 may have a relative permittivity value greater than about 4. Other examples of such materials include aluminum oxide, lanthanum oxide, hafnium oxide, zirconium oxide, hafnium oxynitride, combinations thereof and/or the like.

In an embodiment in which the gate dielectric layer 703 comprise an oxide layer, the gate dielectric layer 703 may be formed by a plasma enhanced CVD (PECVD) process using tetraethoxysilane (TEOS) and oxygen as a precursor. In accordance with an embodiment, the gate dielectric layer 703 may be of a thickness in a range from about 8 Å to about 200 Å.

Figure 8:
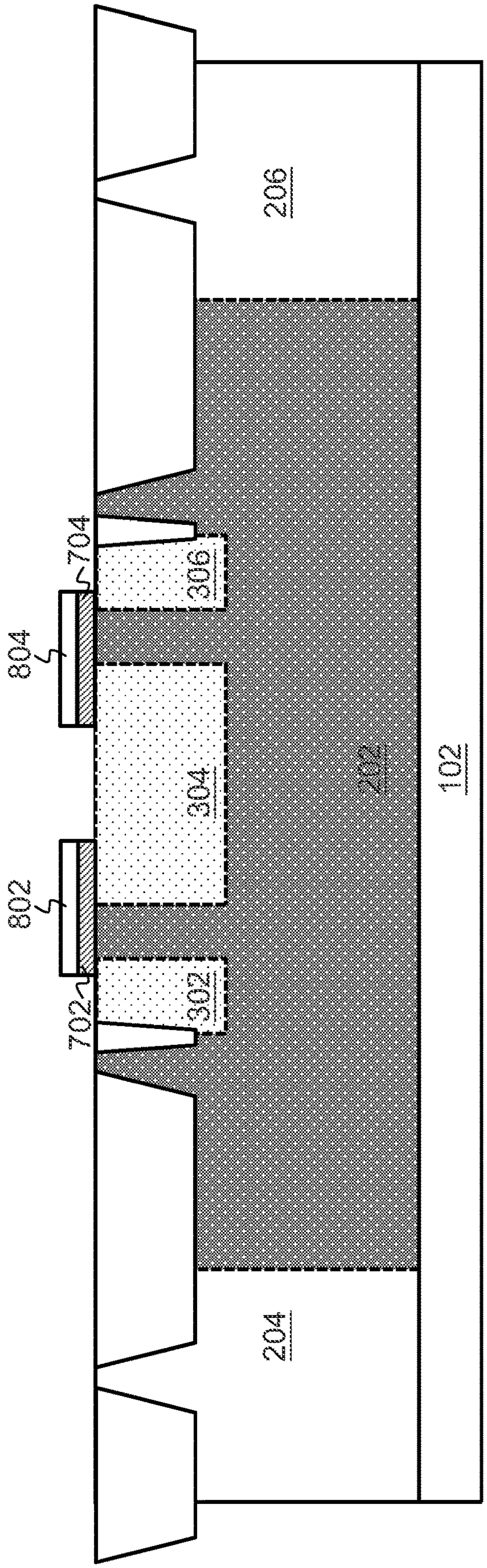

FIG. 8 illustrates a cross section view of the semiconductor device shown in FIG. 7 after a plurality of gate electrodes are formed over the gate dielectric layers in accordance with various embodiments of the present disclosure. The gate electrodes 802 and 804 are deposited over the gate dielectric layer 703.

The gate electrodes 802 and 804 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof and/or the like.

In an embodiment in which the gate electrodes 802 and 804 are formed of poly-silicon, the gate electrodes 802 and 804 may be formed by depositing doped or undoped poly-silicon by low-pressure chemical vapor deposition (LPCVD) to a thickness in the range from about 400 Å to about 2,400 Å. After the deposition of doped or undoped poly-silicon, an etching process may be employed to defined the gate electrodes 802 and 804. The portion of the gate dielectric layer 703 not covered by the gate electrodes 802 and 804 may be removed after the etching process. As shown in FIG. 8, the gate electrodes 802 and 804 are formed over the gate dielectric layers 702 and 704 respectively.

Figure 9:
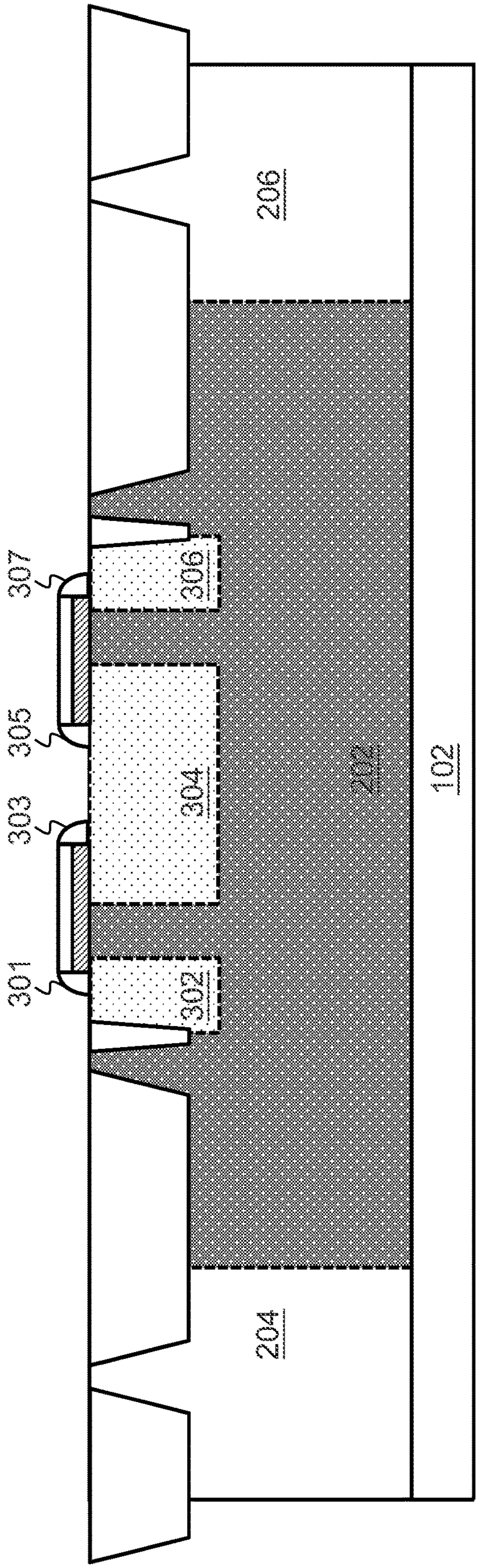

FIG. 9 illustrates a cross section view of the semiconductor device shown in FIG. 8 after a plurality of spacers are formed over the substrate in accordance with various embodiments of the present disclosure. The spacers 301, 303, 305 and 307 may be formed by blanket depositing one or more spacer layers (not shown) over the gate electrodes 802 and 804. The spacers 301, 303, 305 and 307 may comprise suitable dielectric materials such as SiN, oxynitride, SiC, SiON, oxide and/or the like.

Figure 10:
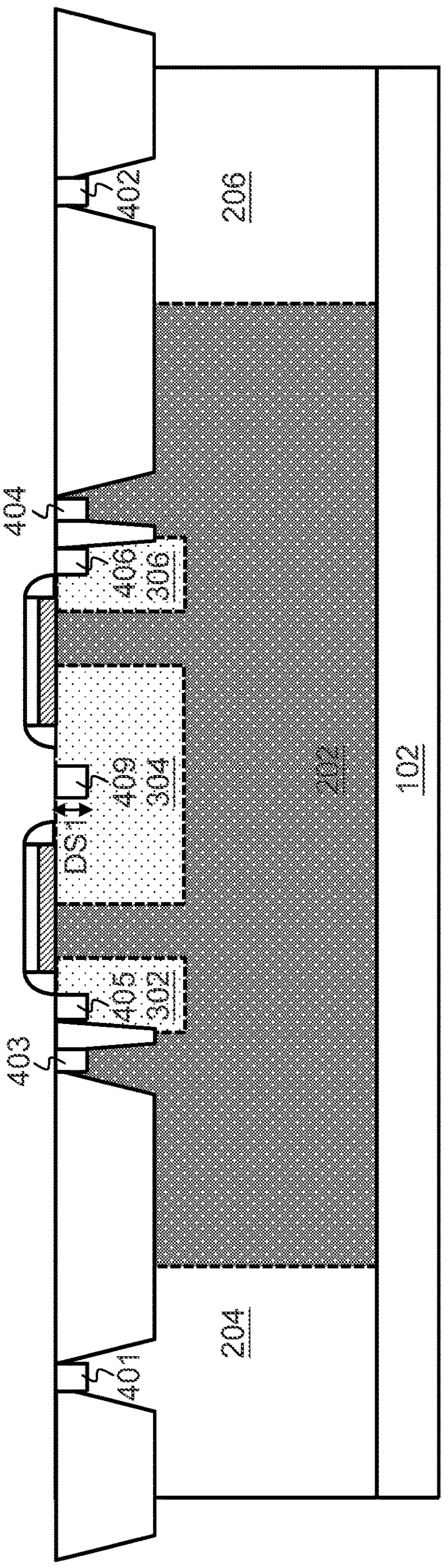

FIG. 10 illustrates a cross section view of the semiconductor device shown in FIG. 9 after drain/source regions are formed over the substrate in accordance with various embodiments of the present disclosure. In accordance with some embodiments, the drain/source regions (e.g., drain/source region 403), well contact regions (e.g., well contact regions 403 and 404) and substrate contact regions (e.g., substrate contact regions 401 and 402) may be formed by implanting appropriate dopants. In some embodiments, the substrate contact regions 401 and 402, the drain/source regions 405, 406 and 409 are implanted by n-type dopants such as phosphorous, arsenic and/or the like.

In accordance with some embodiments, the doping density of the drain/source regions (e.g., drain/source region 112) is in a range from about $10^{18}/cm^3$ to about $1\times10^{21}/cm^3$. The ion implantation depth of the drain/source regions is defined as DS1 as shown in FIG. 10. DS1 is in a range from about 0.02 um to about 0.2 um.

Figure 11:
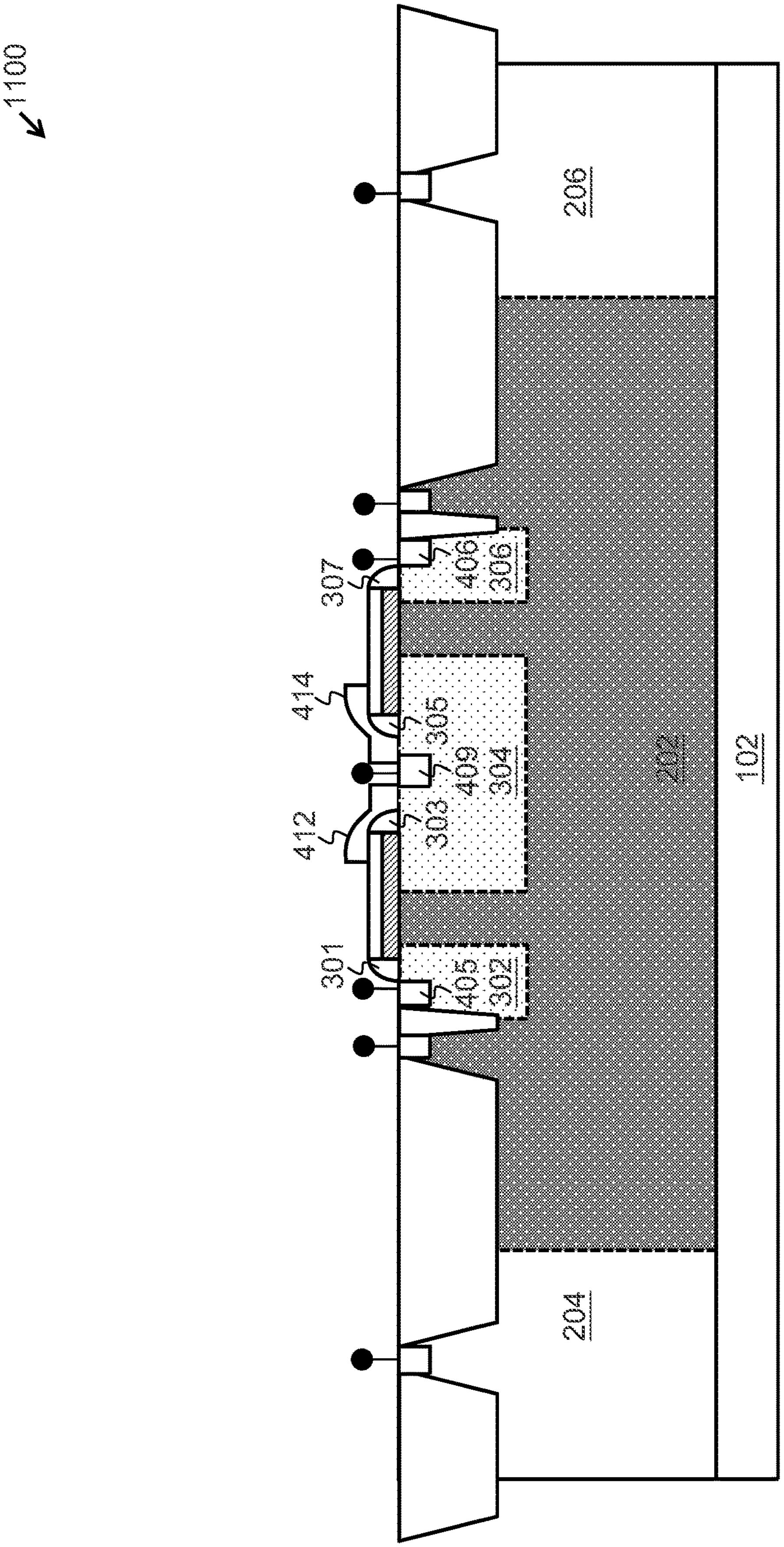

FIG. 11 illustrates a cross section view of the semiconductor device shown in FIG. 10 after protection dielectric layers are formed over the substrate in accordance with various embodiments of the present disclosure. The protection dielectric layers 412 and 414 may comprise a dielectric material such as oxide, nitride or SiON. The protection dielectric layers 412 and 414 may be deposited using suitable semiconductor deposition techniques such as CVD, LECVD, PECVD and/or the like.

Figure 12:
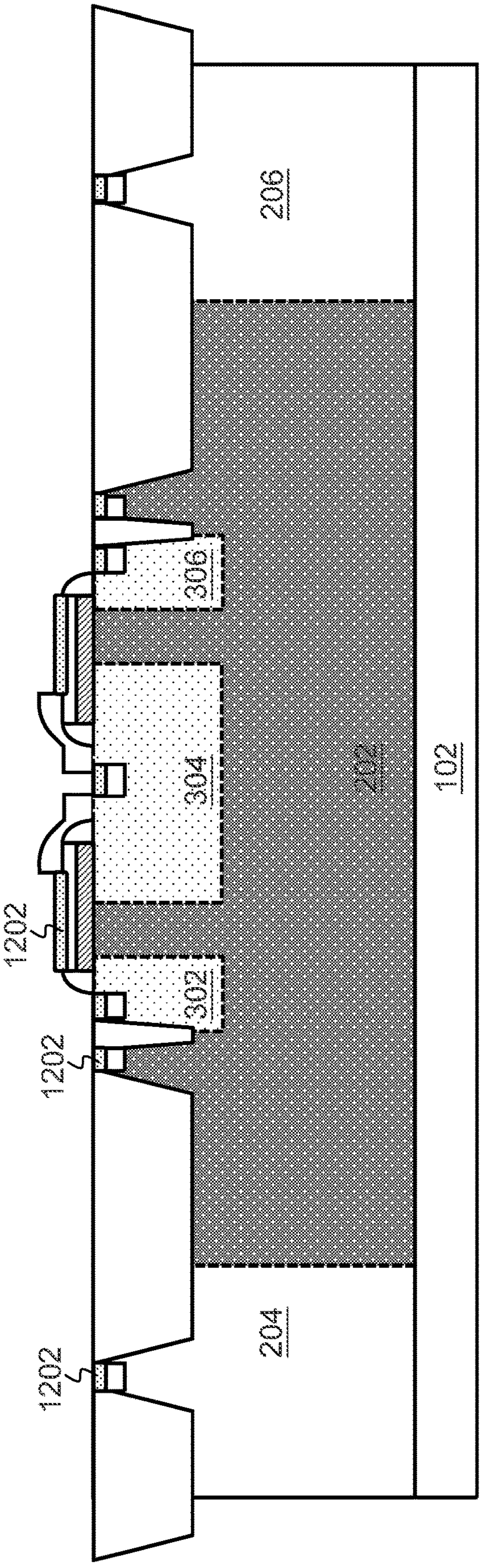

FIG. 12 illustrates a cross sectional view of the semiconductor device shown in FIG. 11 after silicide regions are formed over the drain/source regions, well contact regions, substrate contact regions and gate regions in accordance with various embodiments of the present disclosure. The silicide regions 1202 are formed by a salicide process. In a salicide process, a thin layer of metal is blanket deposited over a semiconductor wafer having exposed drain/source and gate electrode regions. The wafer is then subjected to one or more annealing steps. This annealing process causes the metal to selectively react with the exposed silicon of the source/drain regions and the gate electrodes, thereby forming metal silicide regions over the drain/source regions as well as the gate electrodes. The process is referred to as a self-aligned silicidation process because the silicide layer is formed only where the metal material directly contacts the silicon drain/source regions and the gate electrodes.

In some embodiments, silicide regions 1202 comprise metals that react with silicon such as titanium, platinum, cobalt and the like. However, other metals, such as manganese, palladium and the like, can also be used.

Figure 13:
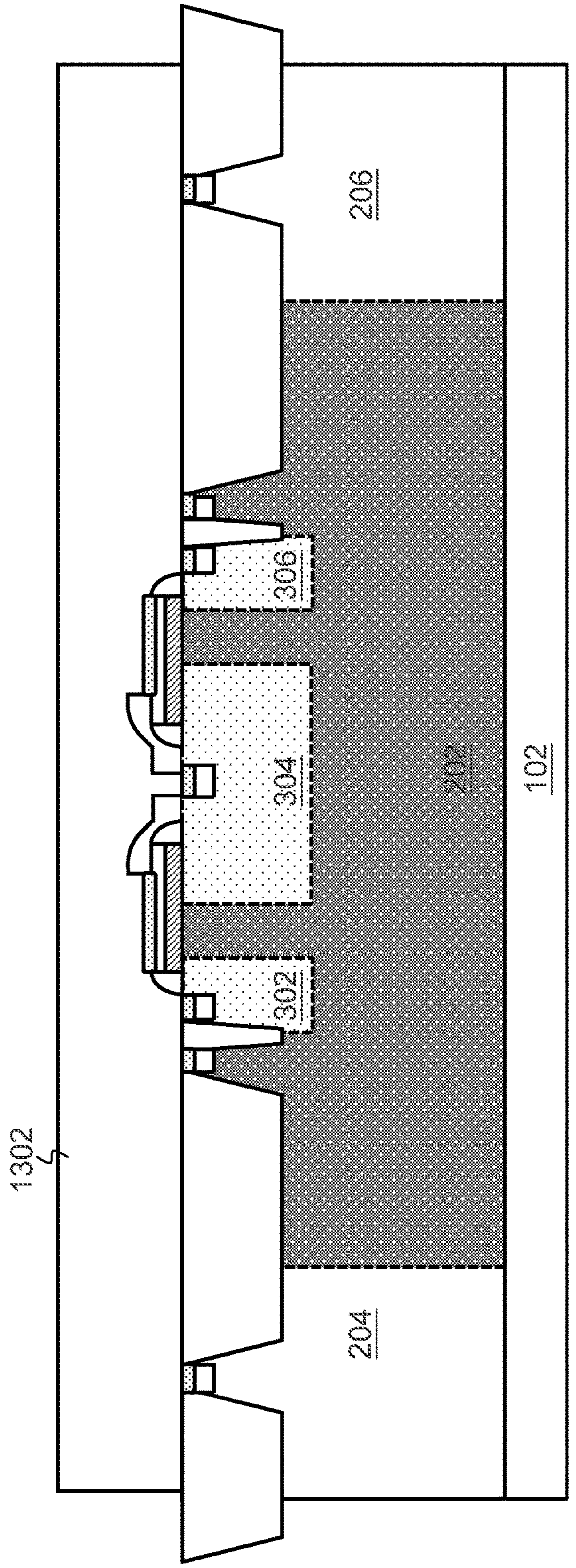
Figure 16:
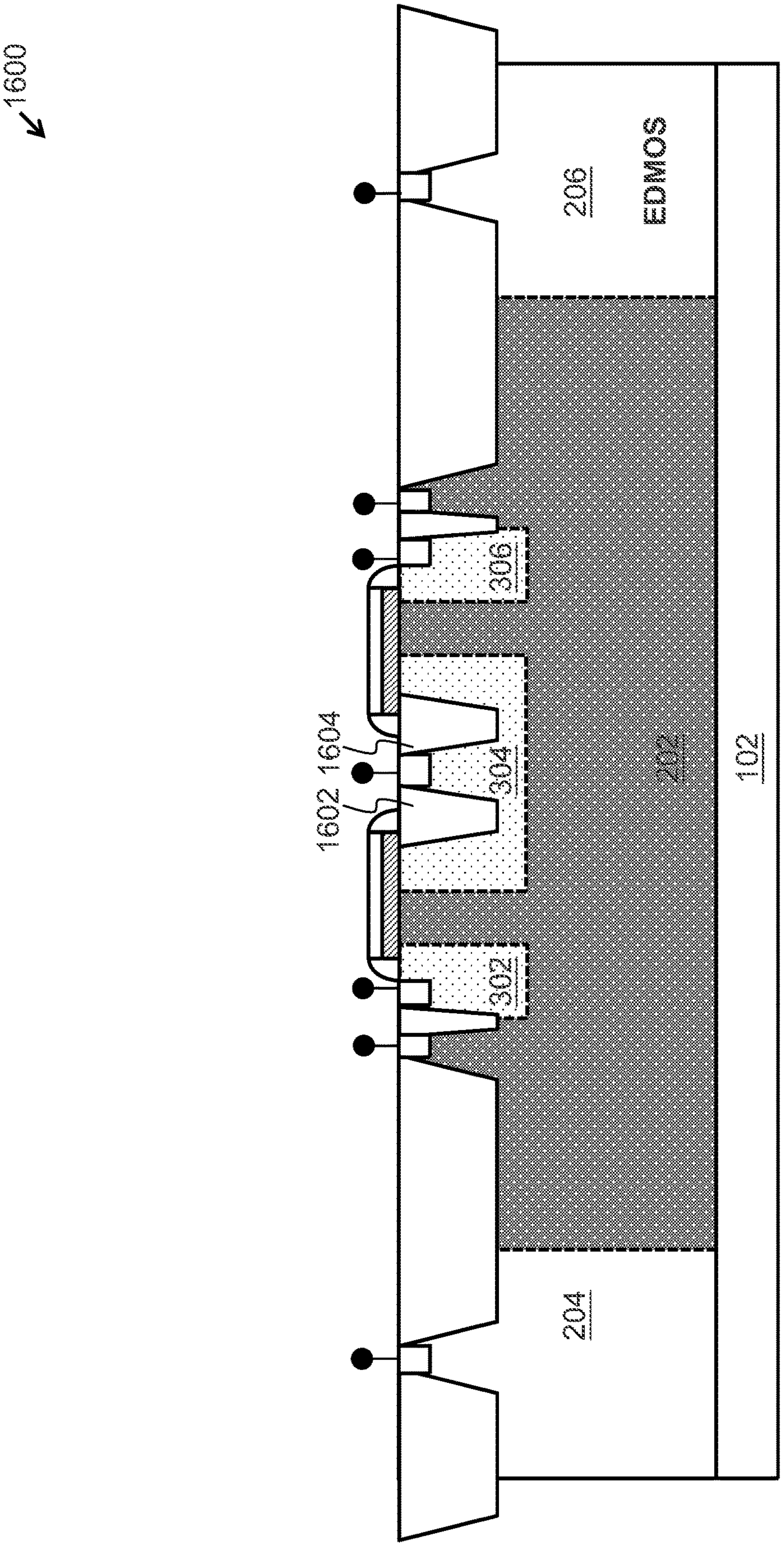
FIG. 16 illustrates a simplified cross-sectional view of another asymmetric p-type DMOS transistor in accordance with various embodiments of the present disclosure.

FIG. 13 illustrates a cross sectional view of the semiconductor device shown in FIG. 16 after a multi film layer is formed on the semiconductor device in accordance with various embodiments of the present disclosure. The multi film layer 1302 may comprise a contact etch stop layer (CESL) and a dielectric layer The CESL layer may comprise commonly used dielectric materials, such as silicon nitride, silicon oxynitride, silicon oxycarbide, silicon carbide, combinations thereof, and multi-layers thereof. The CESL layer is deposited over the semiconductor device through suitable deposition techniques such as sputtering, CVD and the like.

The dielectric layer is deposited over the CESL layer. The dielectric layer may be a low-k dielectric layer having a low dielectric constant, for example, less than about 3.5. The dielectric layer may also comprise a combination of materials, such as silicon nitride, silicon oxy-nitride, high-k dielectrics, low-k dielectrics, CVD poly-silicon or other dielectrics. The dielectric layer may be deposited using suitable deposition techniques such as sputtering, CVD and the like.

Figure 14:
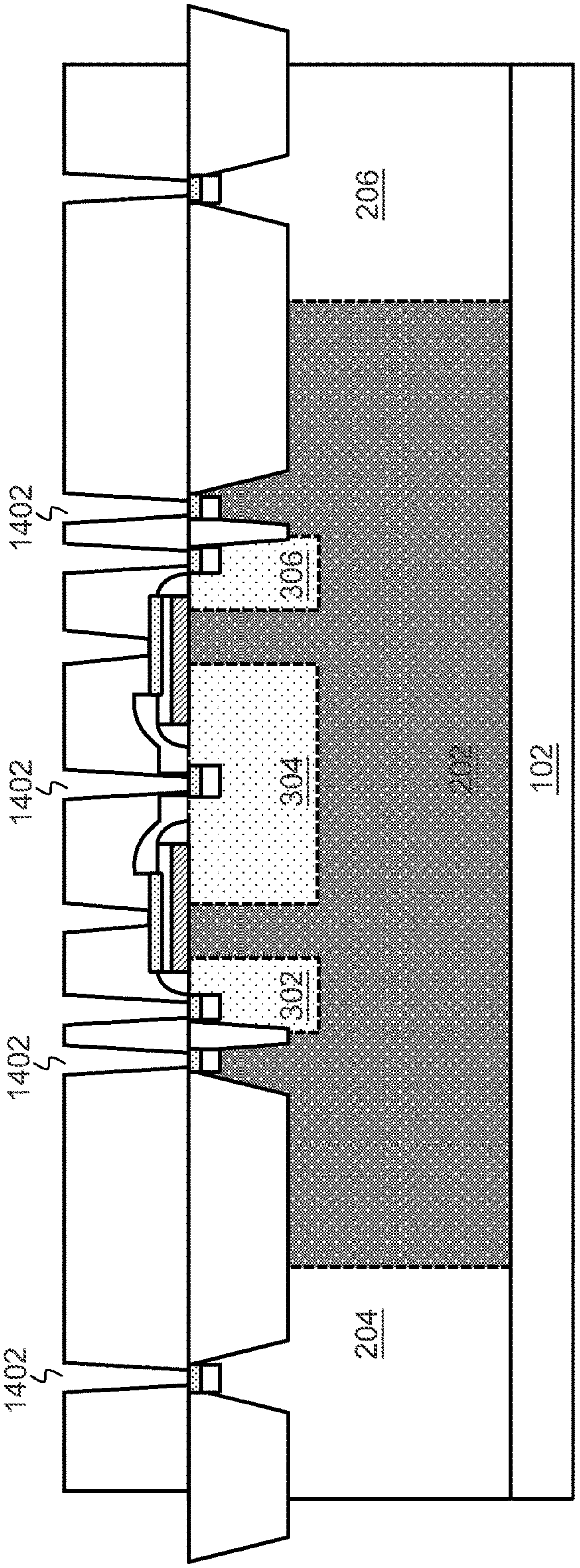

FIG. 14 illustrates a cross section view of the semiconductor device shown in FIG. 13 after an anisotropic etching process is applied to the dielectric layer and the CESL layer of the semiconductor device in accordance with various embodiments of the present disclosure. A plurality of openings 1402 are formed by etching the dielectric layer. With the help of the CESL layer, the etching of the multi film layer 1302 is more precisely controlled. The CESL layer and dielectric layer in the openings 1402 are also removed, exposing the underlying silicide regions over the various regions such as drain/source regions.

Figure 15:
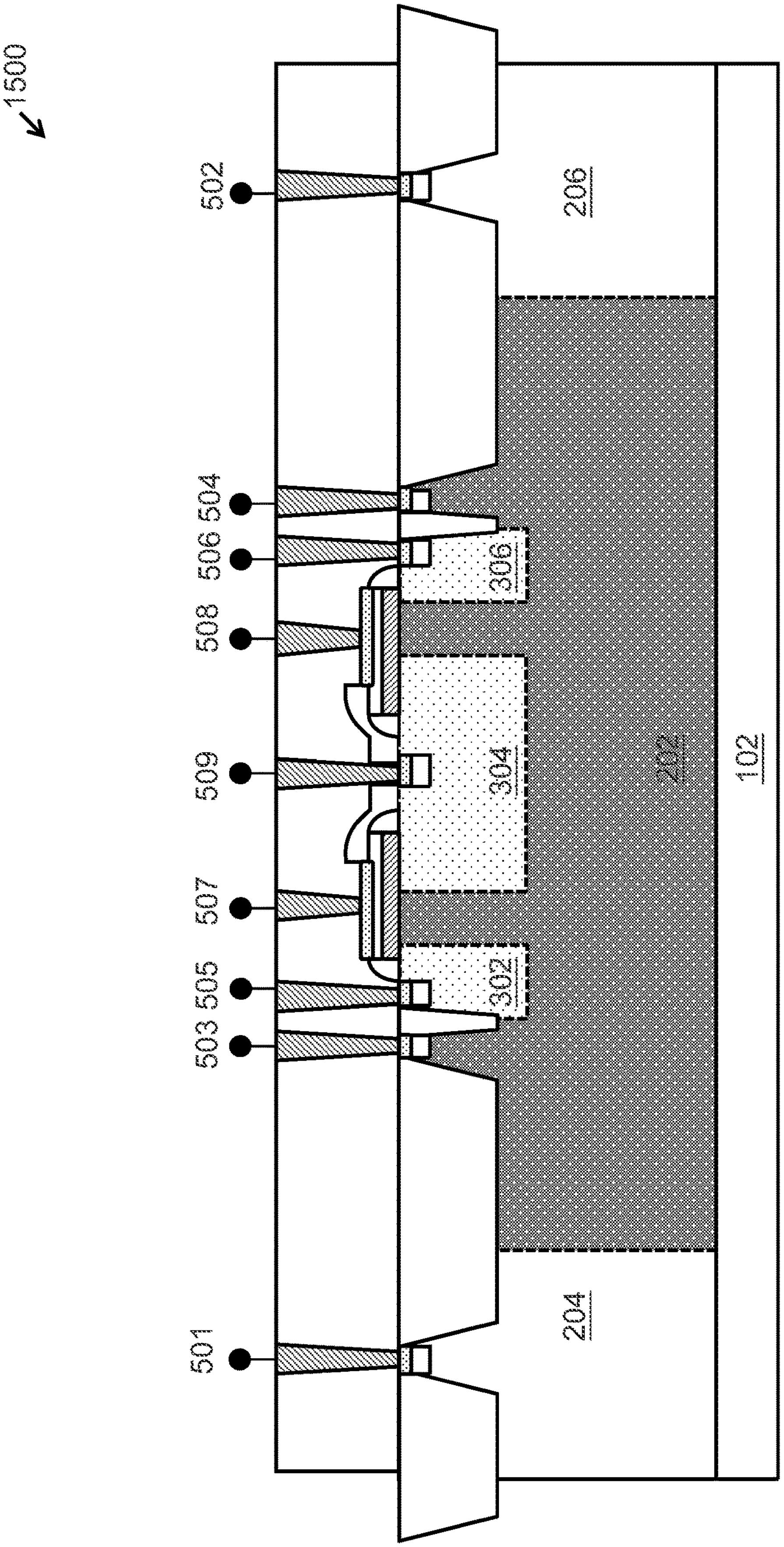

FIG. 15 illustrates a cross section view of the semiconductor device shown in FIG. 14 after metal materials are filled in the openings of the semiconductor device in accordance with various embodiments of the present disclosure. A metallic material, which includes tungsten, titanium, aluminum, copper, any combinations thereof and/or the like, is filled into the openings, forming contact plugs.

FIG. 16 illustrates a simplified cross-sectional view of an extended drain MOS (EDMOS) transistor including the PDD regions in accordance with various embodiments of the present disclosure. The structure of the semiconductor device 1600 is similar to the structure of the semiconductor device 1500 shown in FIG. 15 except that the PDD regions are employed in an extended drain p-type MOS transistor. In particular, FIG. 16 illustrates two STI structures 1602 and 1604 are used to extend the drains of the MOS transistor. EDMOS transistors are well known in the art. The detailed structure of the EDMOS transistor is not discussed in detail herein to avoid unnecessary repetition.

Figure 17:
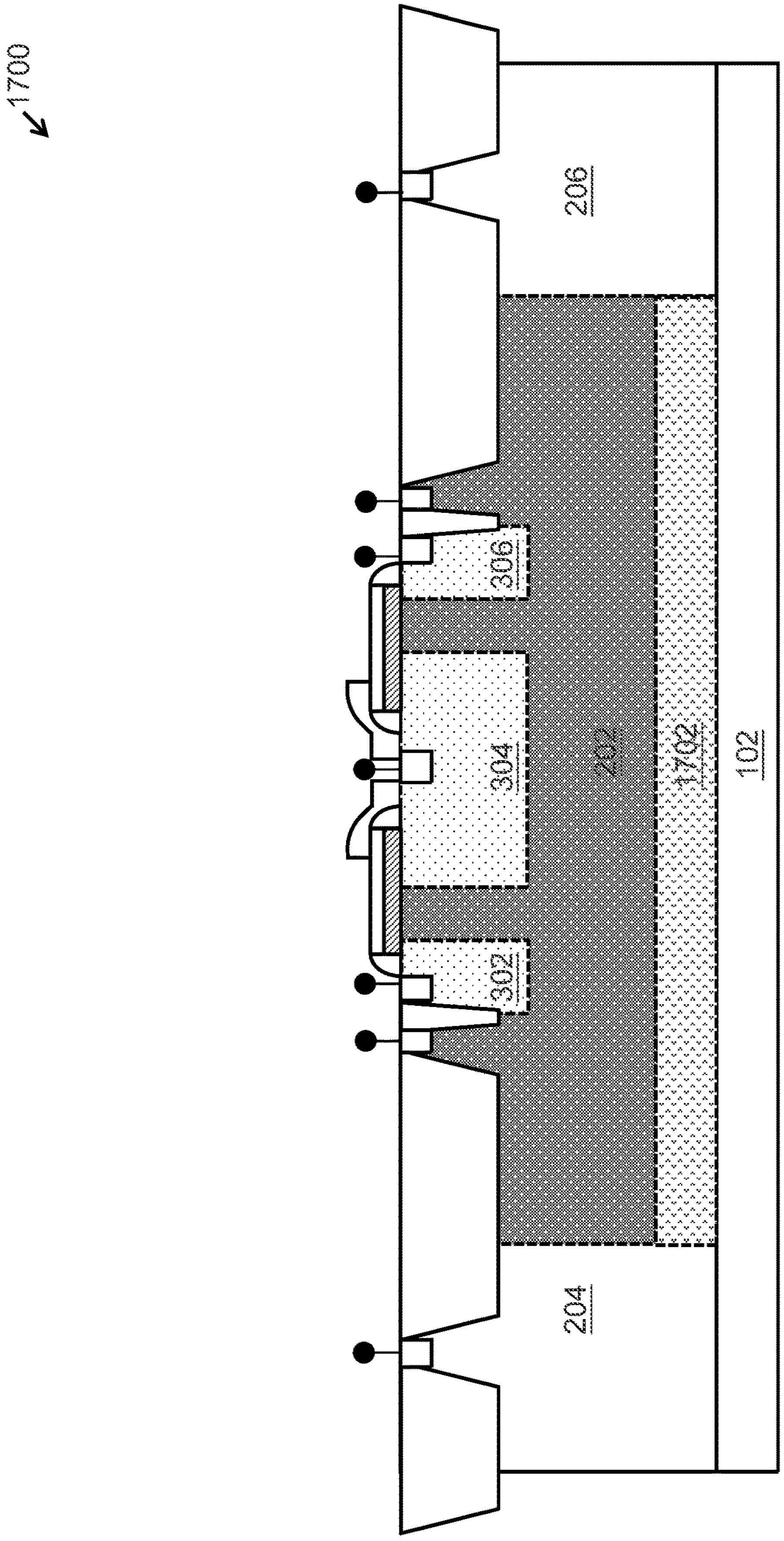
FIG. 17 illustrates a simplified cross-sectional view of an isolated asymmetric p-type DMOS transistor in accordance with various embodiments of the present disclosure.

FIG. 17 illustrates a simplified cross-sectional view of an isolated asymmetric p-type DMOS transistor in accordance with various embodiments of the present disclosure. The structure of the semiconductor device 1700 is similar to the structure of the semiconductor device 1500 shown in FIG. 15 except that the PDD regions are employed in isolated asymmetric p-type DMOS transistor. In particularly, FIG. 17 illustrates an n-type buried layer (NBL) region 1702 is used to provide isolation between the substrate and the MOS transistor. One advantageous feature of having an isolated MOS transistor is the NBL region 1702 helps to reduce noise so that the performance of the semiconductor device 1700 can be improved accordingly.

Isolated asymmetric p-type DMOS transistors are well known in the art. The detailed structure of the isolated asymmetric p-type DMOS transistor is not discussed in detail herein to avoid unnecessary repetition.

Figure 18:
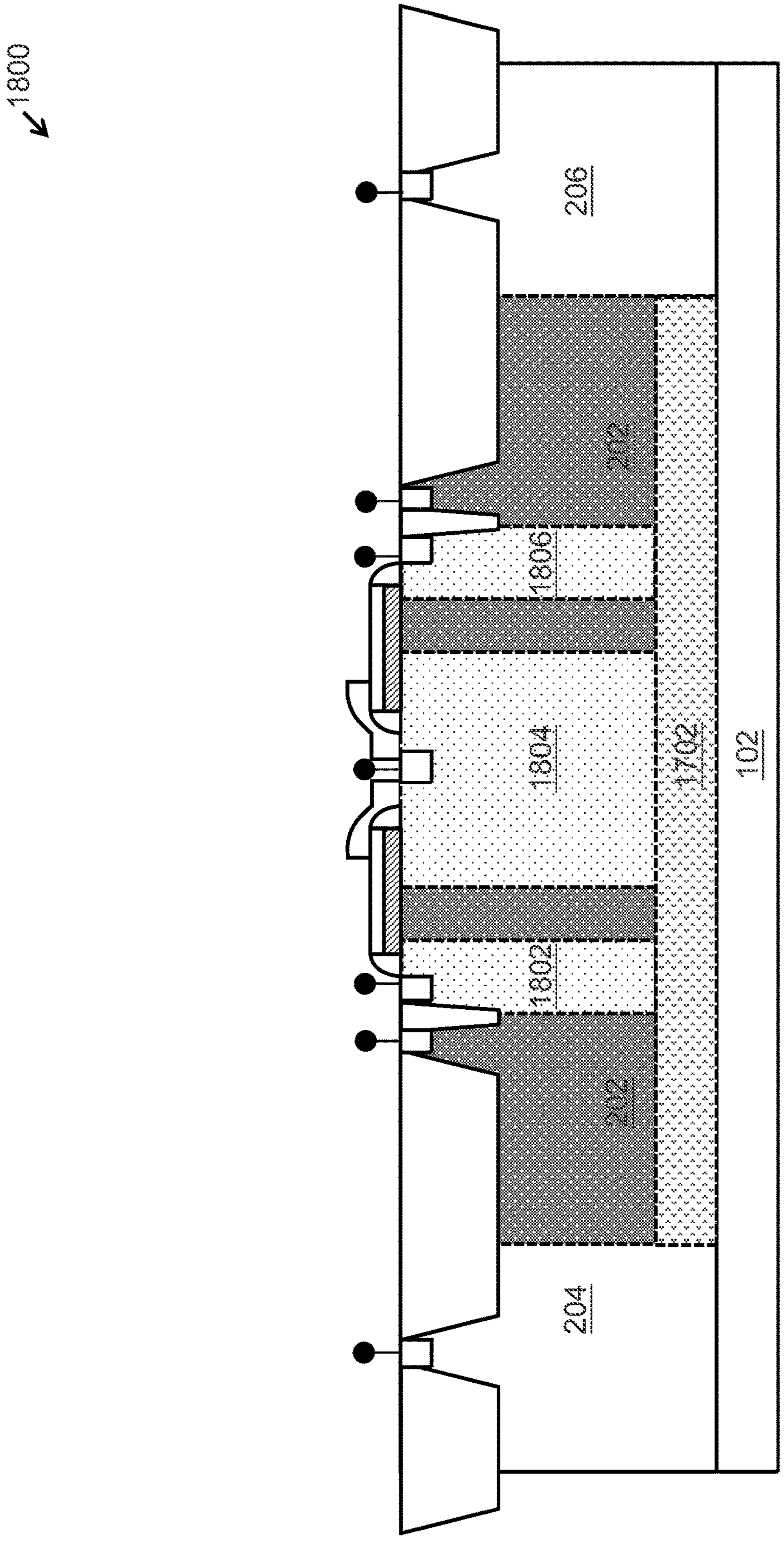
FIG. 18 illustrates a simplified cross-sectional view of another isolated asymmetric p-type DMOS transistor in accordance with various embodiments of the present disclosure.

FIG. 18 illustrates a simplified cross-sectional view of another isolated asymmetric p-type DMOS transistor in accordance with various embodiments of the present disclosure. The structure of the semiconductor device 1800 is similar to the structure of the semiconductor device 1700 shown in FIG. 17 except that the PDD regions 302, 304 and 306 (shown in FIG. 17) are replaced by a plurality of high voltage p-type wells (HVPW) regions 1802, 1804 and 1806. The operation principle of the semiconductor device 1800 is similar to that of the semiconductor device 1700, and hence is not discussed again herein.

Figure 19:
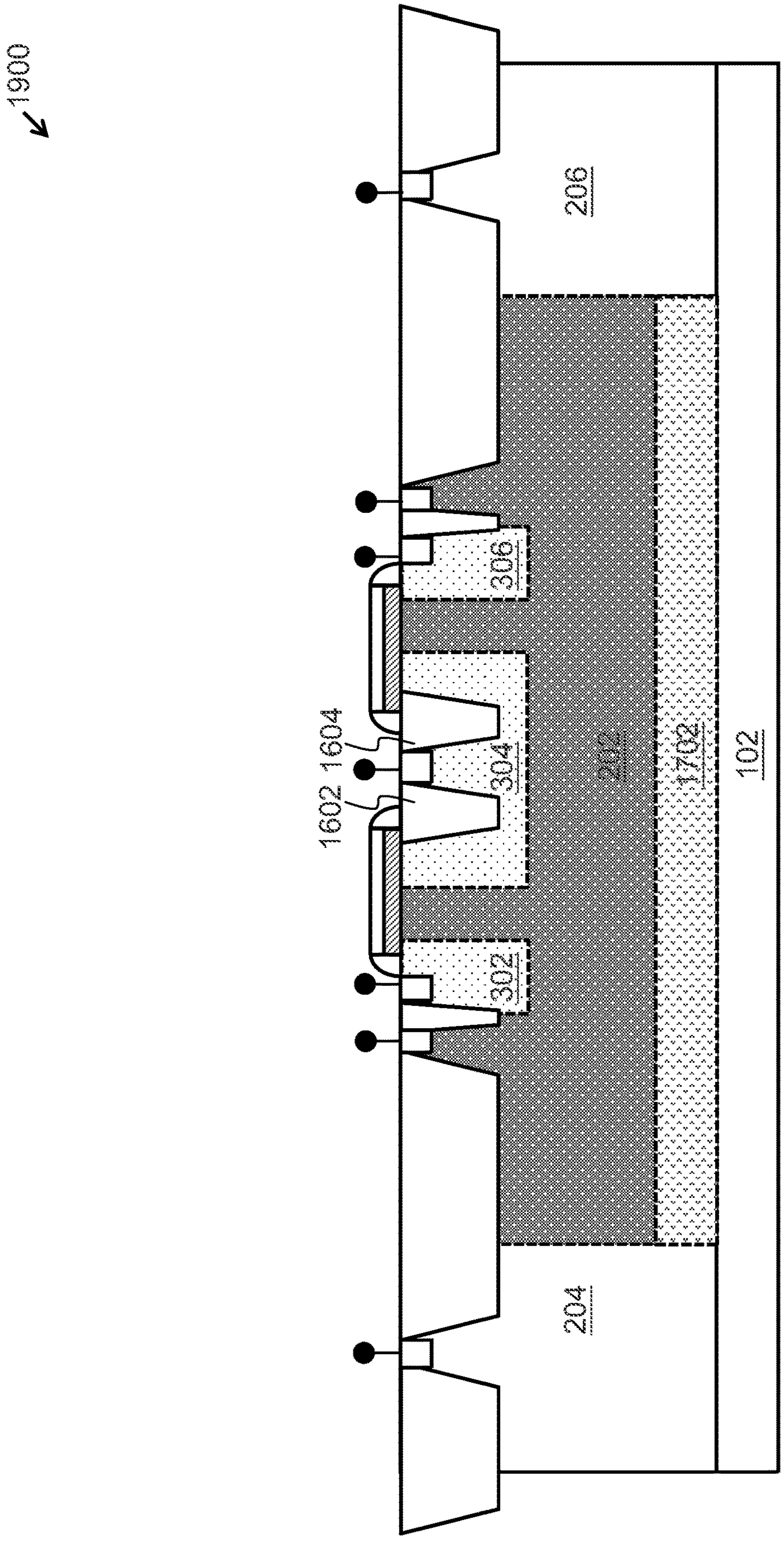
FIG. 19 illustrates a simplified cross-sectional view of yet another isolated asymmetric p-type DMOS transistor in accordance with various embodiments of the present disclosure.

FIG. 19 illustrates a simplified cross-sectional view of yet another isolated asymmetric p-type DMOS transistor in accordance with various embodiments of the present disclosure. The structure of the semiconductor device 1900 is similar to the structure of the semiconductor device 1700 shown in FIG. 17 except that the PDD regions are employed in an isolated extended drain p-type MOS transistor. Isolated extended drain p-type MOS transistors are well known in the art. The detailed structure of the extended drain p-type MOS transistor is not discussed in detail herein to avoid unnecessary repetition.

Figure 20:
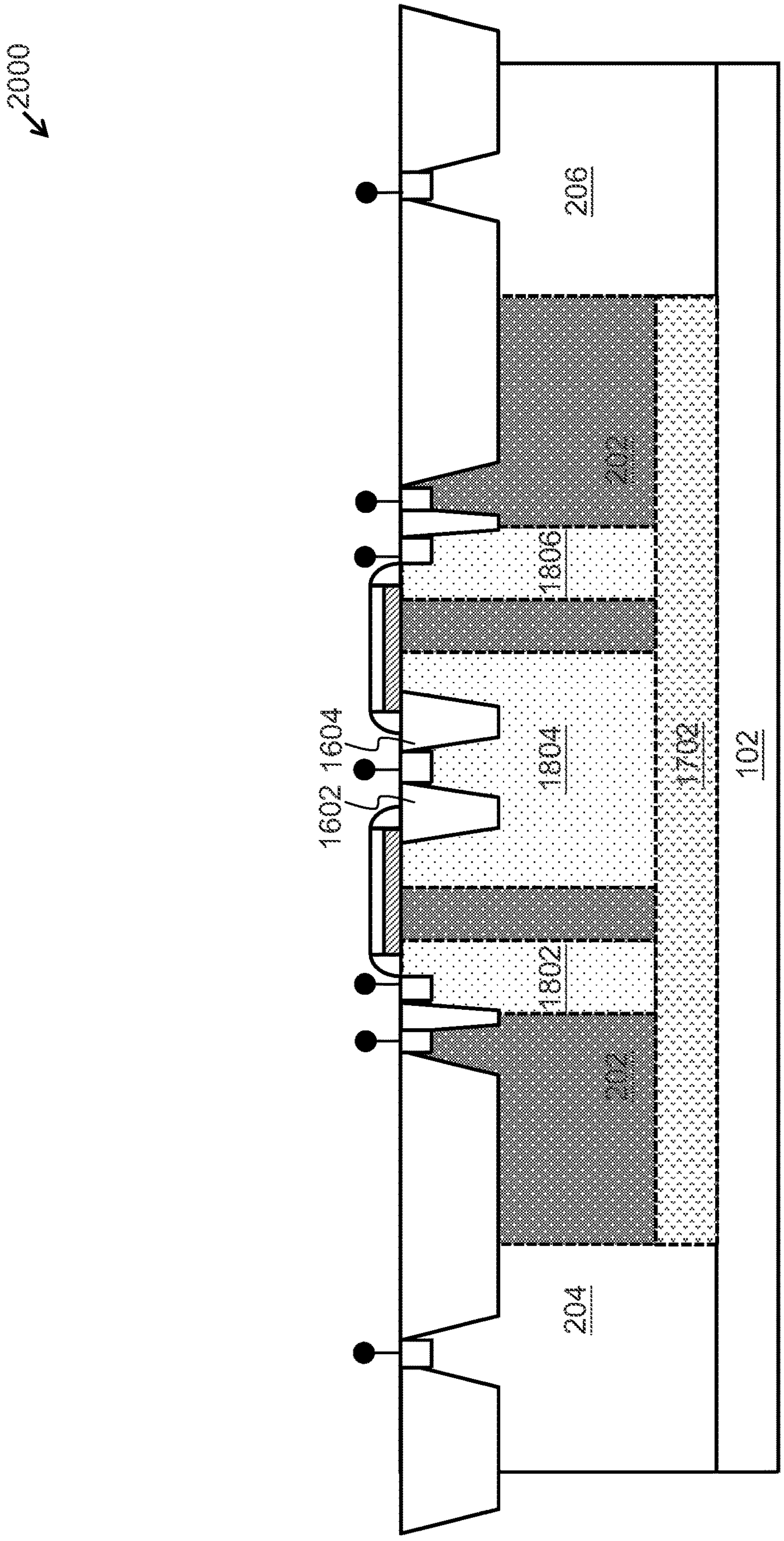
FIG. 20 illustrates a simplified cross-sectional view of yet another isolated asymmetric p-type DMOS transistor in accordance with various embodiments of the present disclosure.

FIG. 20 illustrates a simplified cross-sectional view of yet another isolated asymmetric p-type DMOS transistor in accordance with various embodiments of the present disclosure. The structure of the semiconductor device 2000 is similar to the structure of the semiconductor device 1800 shown in FIG. 18 except that the PDD regions are employed in an isolated extended drain p-type MOS transistor. Isolated extended drain p-type MOS transistors are well known in the art. The detailed structure of the extended drain p-type MOS transistor is not discussed in detail herein to avoid unnecessary repetition.

FIGS. 21-33 illustrate cross section views of intermediate steps of fabricating an asymmetric n-type DMOS transistor in accordance with various embodiments of the present disclosure.

Figure 21:
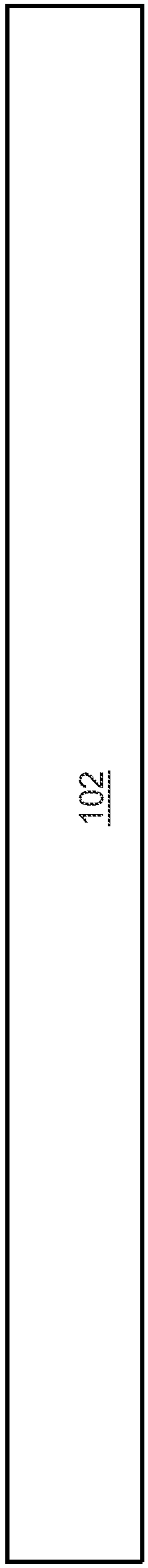
FIGS. 21-33 illustrate cross section views of intermediate steps of fabricating an asymmetric n-type DMOS transistor in accordance with various embodiments of the present disclosure.

FIG. 21 illustrates a cross section view of a substrate in accordance with various embodiments of the present disclosure. The substrate 102 is formed of silicon, although it may also be formed of other group III, group IV, and/or group V elements, such as silicon, germanium, gallium, arsenic, and combinations thereof.

As is known to those of skill in the art, the use of dopant atoms in an implant step may form the substrate 102 with a particular conductivity type. Depending on different applications, the substrate 102 may be n-type or p-type. In some embodiments, the substrate 102 is a p-type substrate. Appropriate p-type dopants such as boron, gallium, indium and/or the like are implanted into the substrate 102. Alternatively, the substrate 102 is an n-type substrate. Appropriate n-type dopants such as phosphorous, arsenic and/or the like are implanted into the substrate 102. In some embodiments, the substrate 102 is a p-type substrate.

Figure 22:
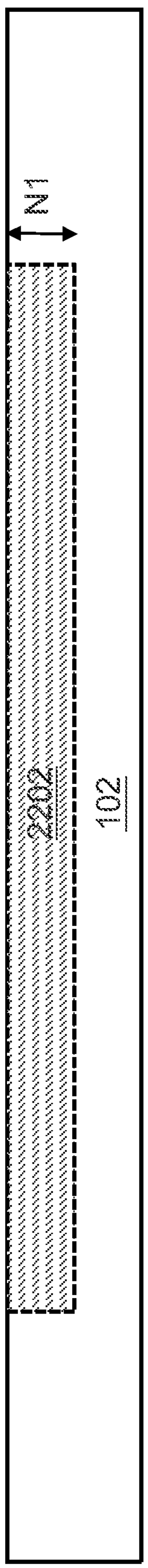

FIG. 22 illustrates a cross section view of the semiconductor device shown in FIG. 21 after an ion implantation process is applied to the substrate in accordance with various embodiments of the present disclosure. An n-type buried layer (NBL) region 2202 is formed through suitable semiconductor doping techniques such as an ion implantation process.

Alternatively, the NBL region 2202 can be formed by a diffusion process. In some embodiments, appropriate n-type dopants such as phosphorous, arsenic and/or the like are implanted into the substrate 102 to form the NBL region 2202.

In some embodiments, the doping concentration of the NBL region 202 is in a range from about $1\times10^{17}/cm^3$ to about $1\times10^{19}/cm^3$. By controlling the ion implantation energy, the depth of the NBL region 2202 may be adjusted accordingly. In some embodiments, the depth as shown in FIG. 22 is defined as N1. The depth N1 is in a range from about 0.01 um to about 1 um.

Figure 23:
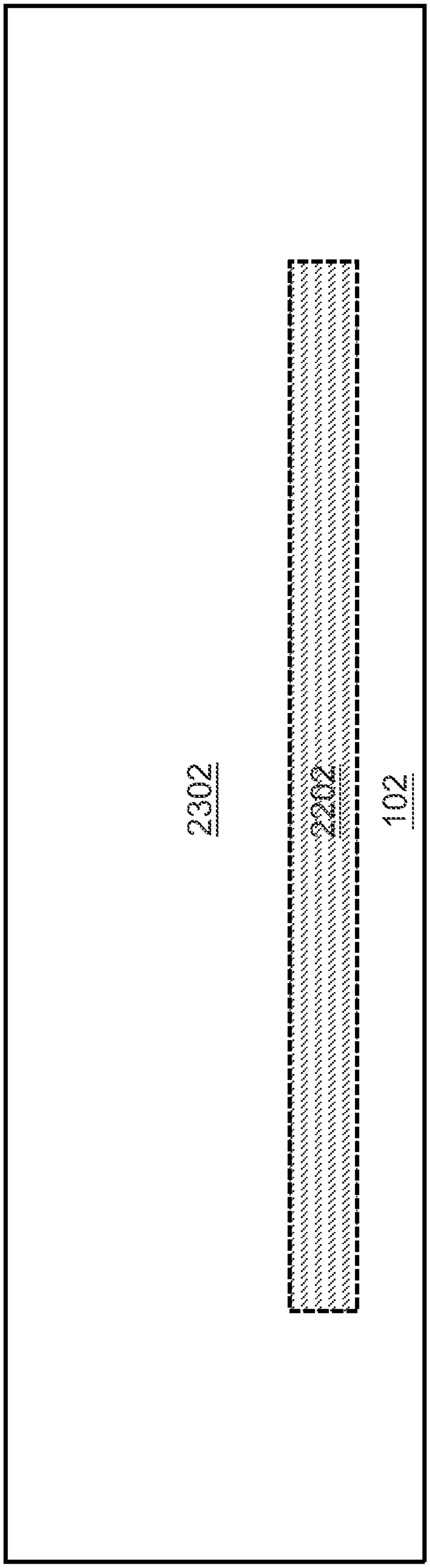

FIG. 23 illustrates a cross section view of the semiconductor device shown in FIG. 22 after an epitaxial growth process is applied to the substrate in accordance with various embodiments of the present disclosure. A p-type epitaxial layer 2302 is grown from the NBL region 2202. The epitaxial growth of the p-type epitaxial layer 2302 may be implemented by using any suitable semiconductor fabrication processes such as CVD, ultra-high vacuum chemical vapor deposition (UHV-CVD) and the like.

Figure 24:
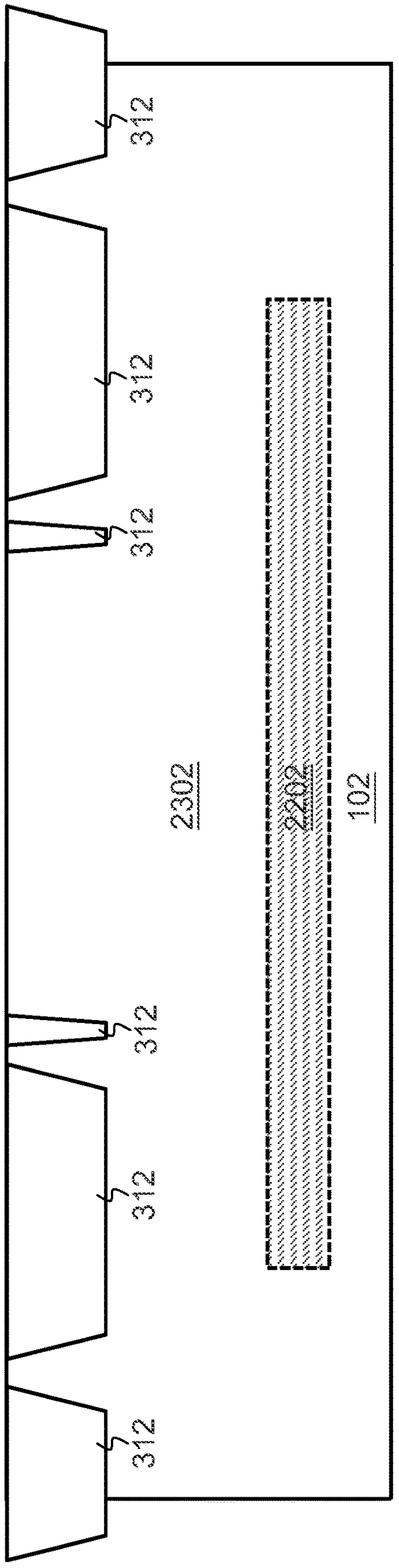

FIG. 24 illustrates a cross section view of the substrate after a plurality of isolation regions are formed in the substrate in accordance with various embodiments of the present disclosure. The isolation regions 312 may be shallow trench isolation (STI) regions, and may be formed by etching the p-type epitaxial layer 2302 to form a trench and filling the trench with a dielectric material as is known in the art. For example, the isolation regions 312 may be filled with a dielectric material such as an oxide material, a high-density plasma (HDP) oxide and/or the like. The dielectric materials are formed using suitable semiconductor deposition techniques such as sputtering, CVD and/or the like.

Figure 25:
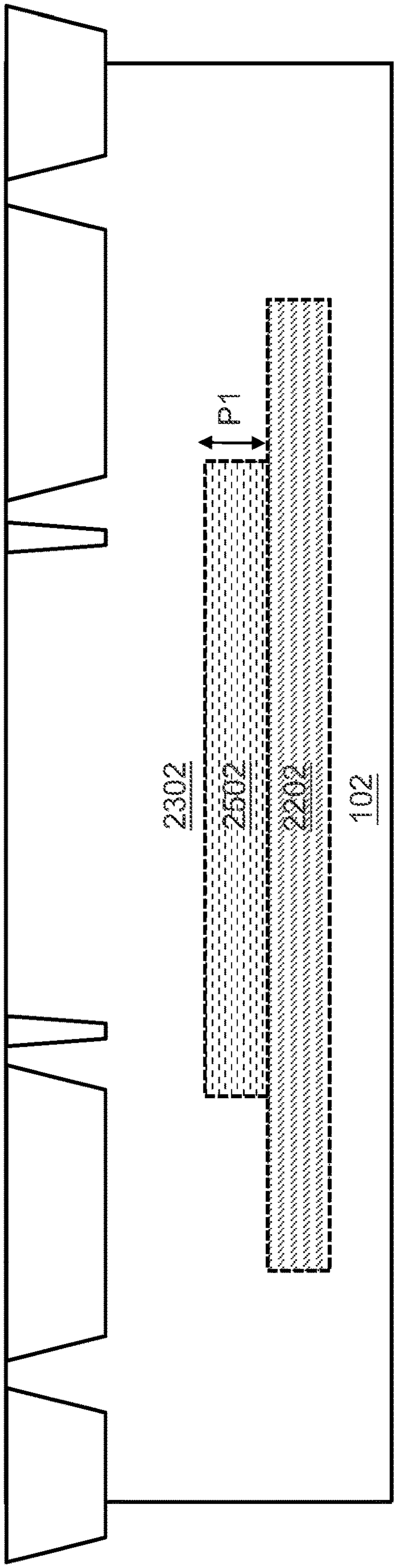

FIG. 25 illustrates a cross section view of the semiconductor device shown in FIG. 24 after an ion implantation process is applied to the substrate in accordance with various embodiments of the present disclosure. A p-type buried layer (PBL) region 2502 is formed over the NBL region 2202. The PBL region 2502 may be formed through suitable semiconductor doping techniques such as an ion implantation process. Alternatively, the PBL region 2502 can be formed by a diffusion process. In some embodiments, appropriate p-type dopants such as boron, indium, fluorine and/or the like are implanted into the p-type epitaxial layer 2302 to form the PBL region 2502.

In some embodiments, the doping concentration of the PBL region 2502 is in a range from about $1\times10^{17}/cm^3$ to about $1\times10^{19}/cm^3$. By controlling the ion implantation energy, the depth of the PBL region 2502 may be adjusted accordingly. In accordance with some embodiments, the depth as shown in FIG. 25 is defined as P1. P1 is in a range from about 2 um to about 5 um.

Figure 26:
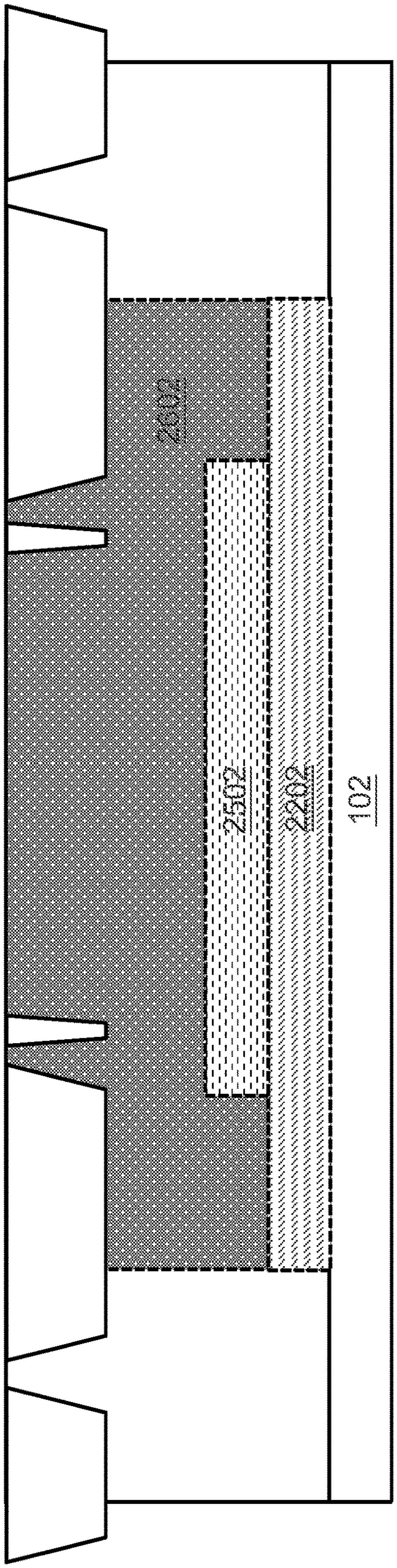

FIG. 26 illustrates a cross section view of the semiconductor device shown in FIG. 25 after another ion implantation process is applied to the epitaxial layer in accordance with various embodiments of the present disclosure. A high voltage p-type well (HVPW) region 2602 is formed through suitable semiconductor doping techniques such as an ion implantation process. In some embodiments, appropriate p-type dopants such as boron, fluorine and/or the like are implanted into the epitaxial layer 2302 to form the HVPW region 2602.

In some embodiments, the doping concentration of the HVPW region 2602 is in a range from about $1\times10^{15}/cm^3$ to about $1\times10^{18}/cm^3$. By controlling the ion implantation energy, the depth of the HVPW region 2602 may be adjusted accordingly. In some embodiments, the ion implantation depth of the HVPW region 2602 is in a range from about 0.4 um to about 5 um.

Figure 27:
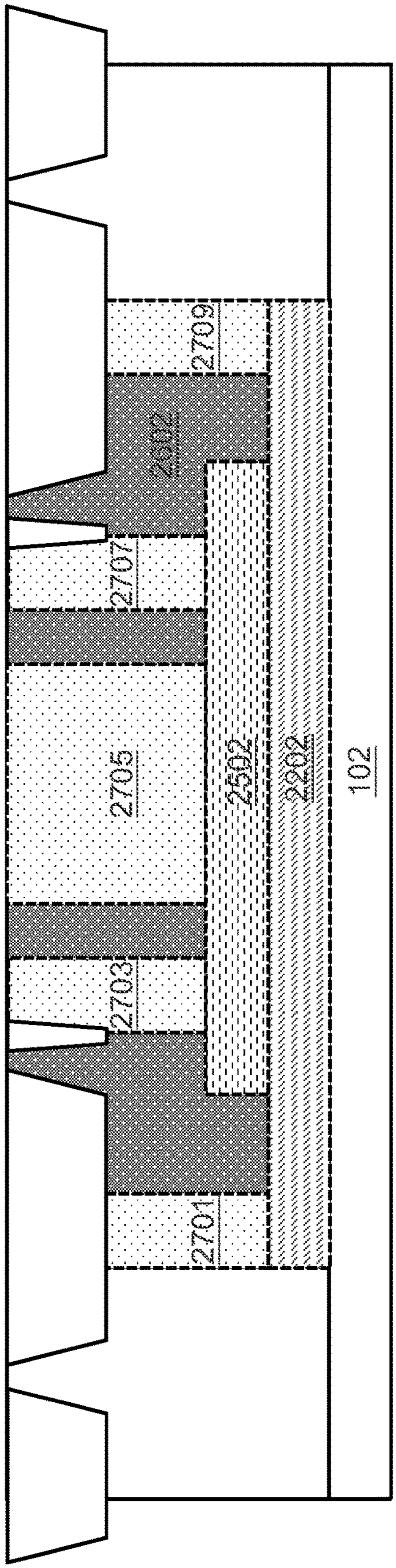
Figure 28:
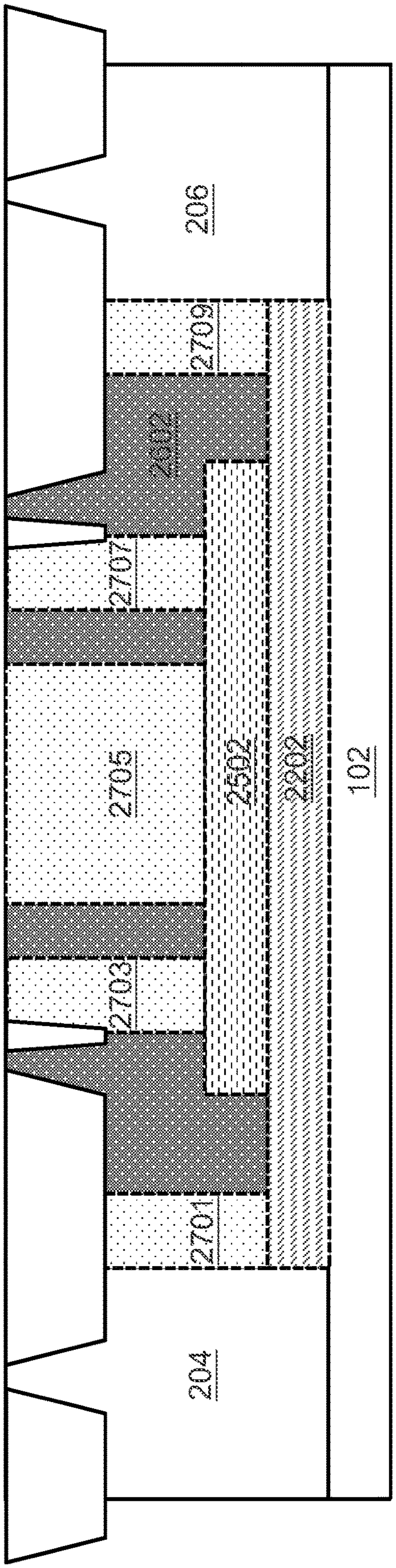
Figure 29:
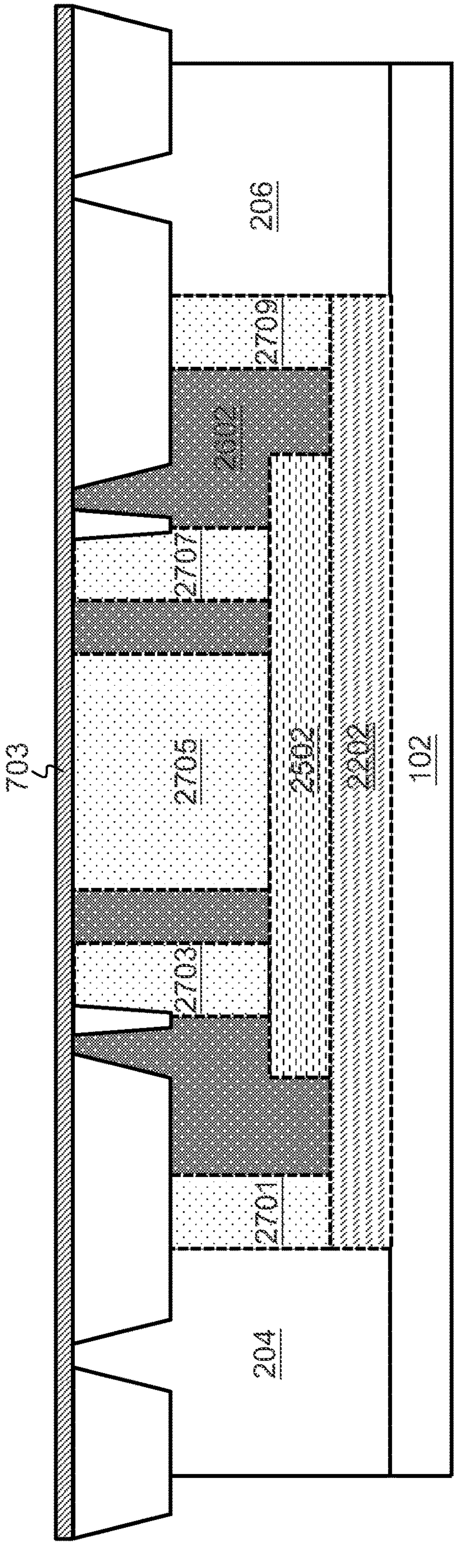
Figure 30:
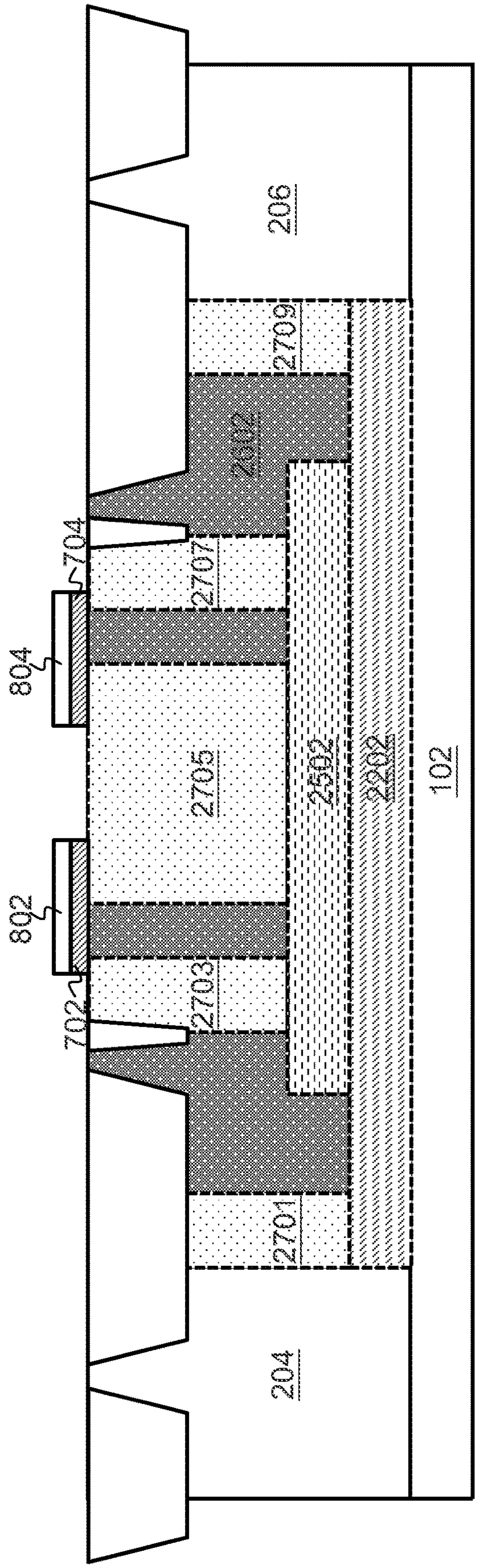
Figure 31:
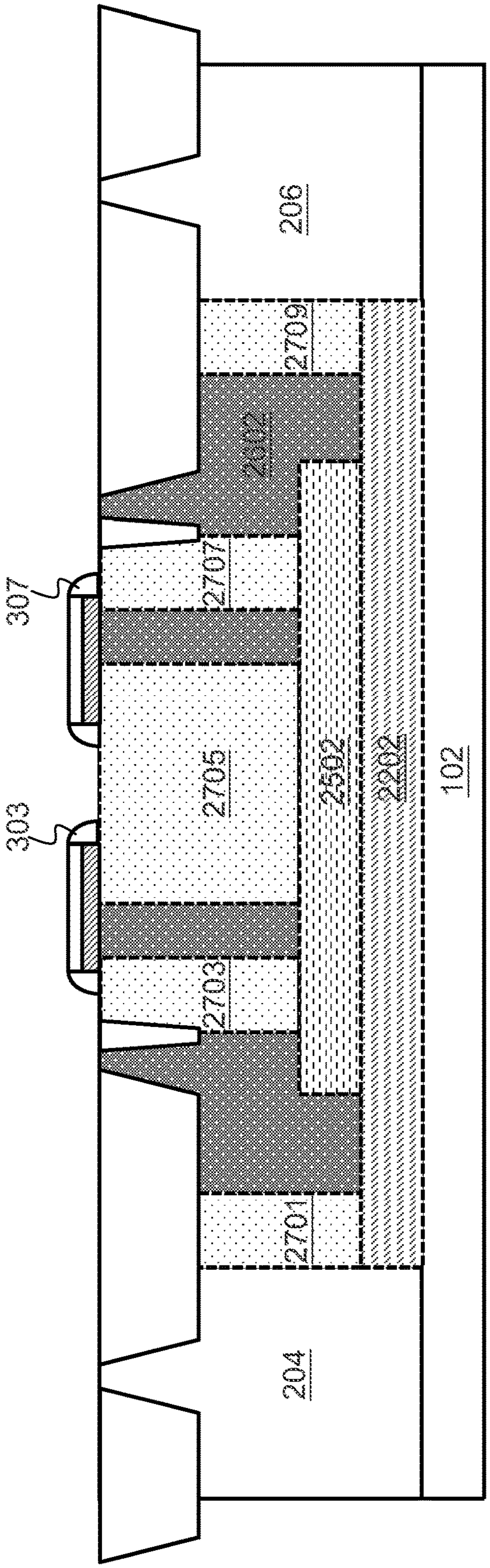
Figure 32:
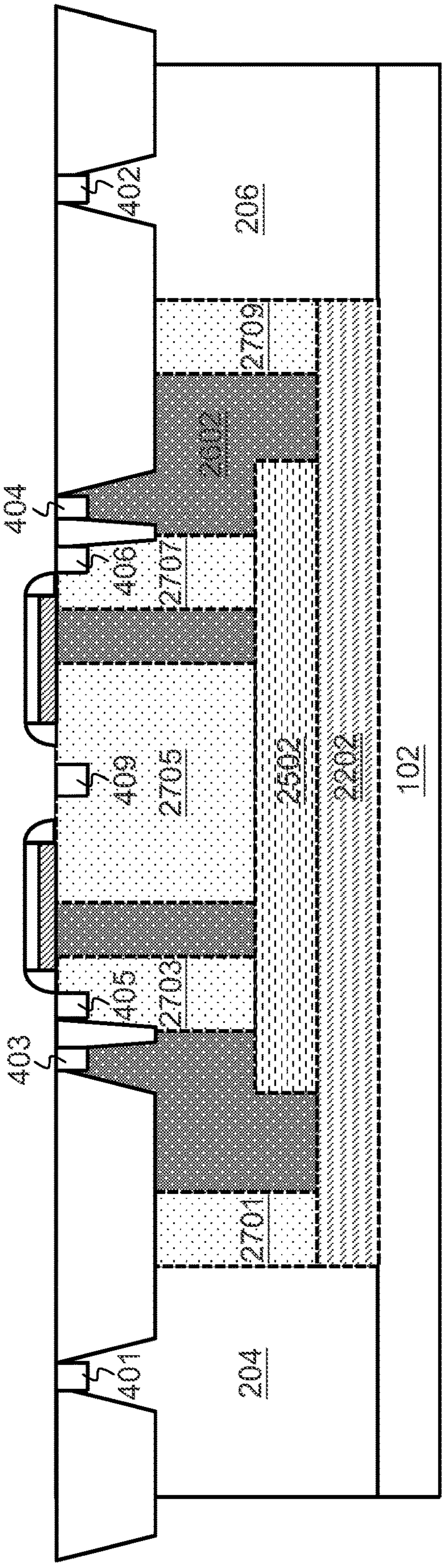

FIG. 27 illustrates a cross section view of the semiconductor device shown in FIG. 26 after another ion implantation process is applied to the HVPW region in accordance with various embodiments of the present disclosure. A plurality of HVNW regions 2701, 2703, 2705, 2707 and 2709 are formed through suitable semiconductor doping techniques such as an ion implantation process. In some embodiments, appropriate n-type dopants such as phosphors, arsenic and/or the like are implanted into the HVPW region 2602 to form the plurality of HVNW regions.

In some embodiments, the doping concentration of the plurality of HVNW regions is in a range from about $1\times10^{15}/cm^3$ to about $1\times10^{18}/cm^3$. By controlling the ion implantation energy, the depths of the plurality of HVNW regions may be adjusted accordingly. In some embodiments, the ion implantation depths of the plurality of HVNW regions are in a range from about 0.4 um to about 5 um.

FIGS. 28-33 illustrate the fabrication steps of forming PW regions, gate dielectric layers, gate electrodes, spacers, drain/source regions and protection dielectric layers in accordance with various embodiments of the present disclosure. These fabrication steps may be similar to the fabrication steps shown in FIGS. 5, 7-12, and hence are not discussed in detail to avoid unnecessary repetition.

Figure 33:
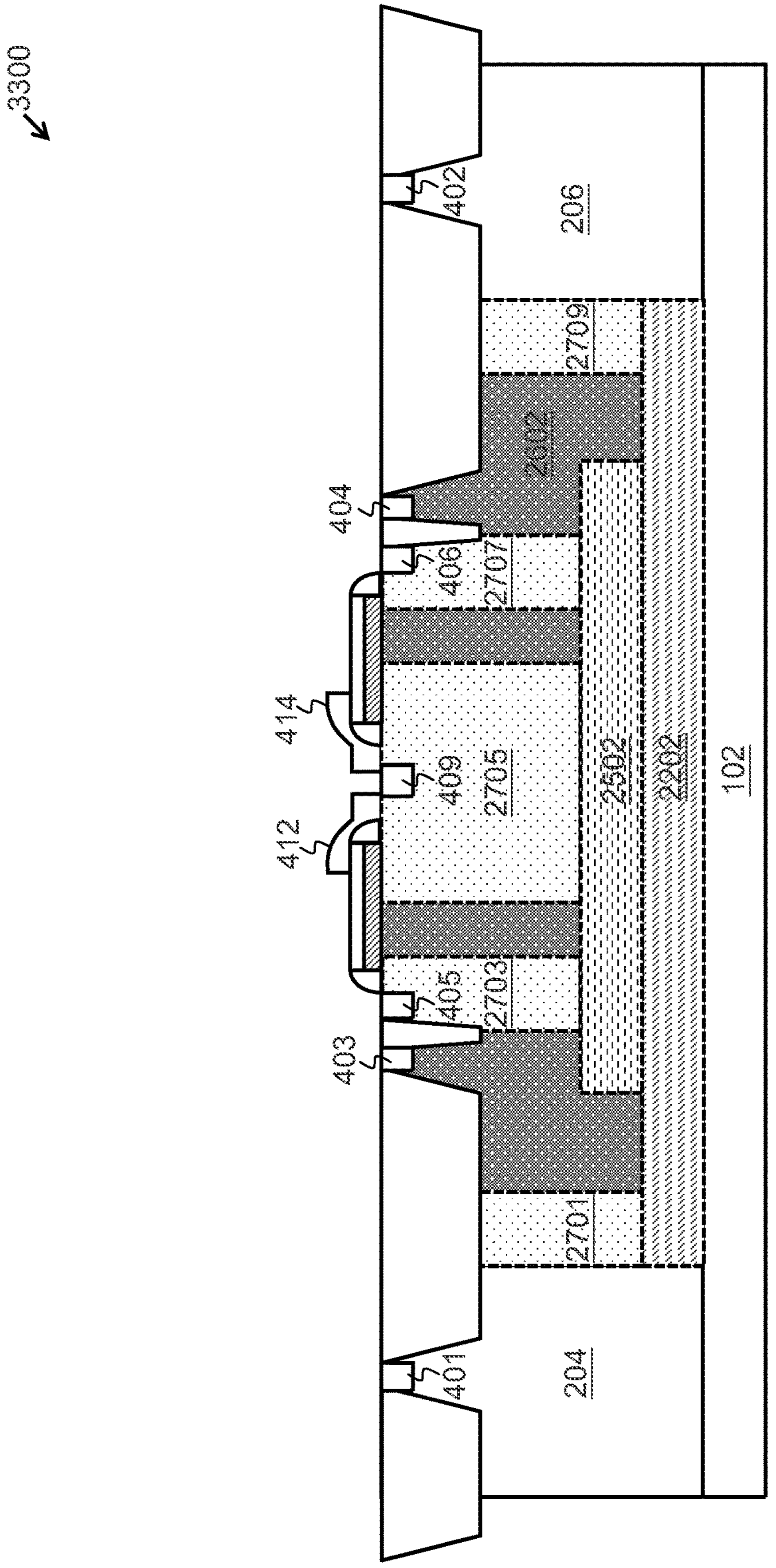
Figure 34:
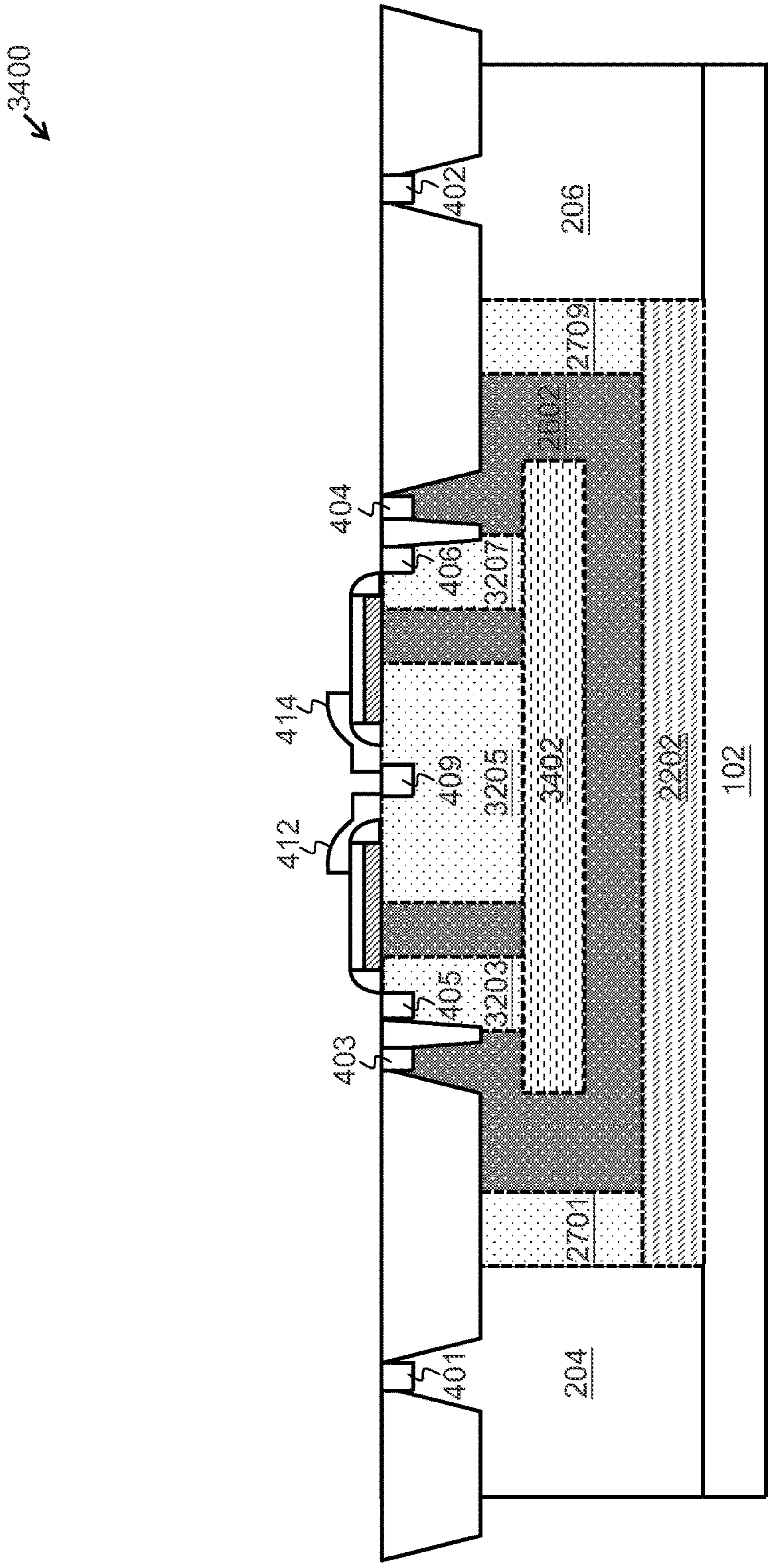
FIG. 34 illustrates a simplified cross-sectional view of another asymmetric n-type DMOS transistor in accordance with various embodiments of the present disclosure.

FIG. 34 illustrates a simplified cross-sectional view of another asymmetric n-type DMOS transistor in accordance with various embodiments of the present disclosure. The structure of the semiconductor device 3400 is similar to the structure of the semiconductor device 3300 except that the HVNW regions 2703, 2705 and 2707 shown in FIG. 33 are replaced by NDD regions 3203, 3205 and 3207 respectively. The operation principle of the semiconductor device 3400 is similar to that the semiconductor device 3300, and hence is not discussed in detail herein.

Figure 35:
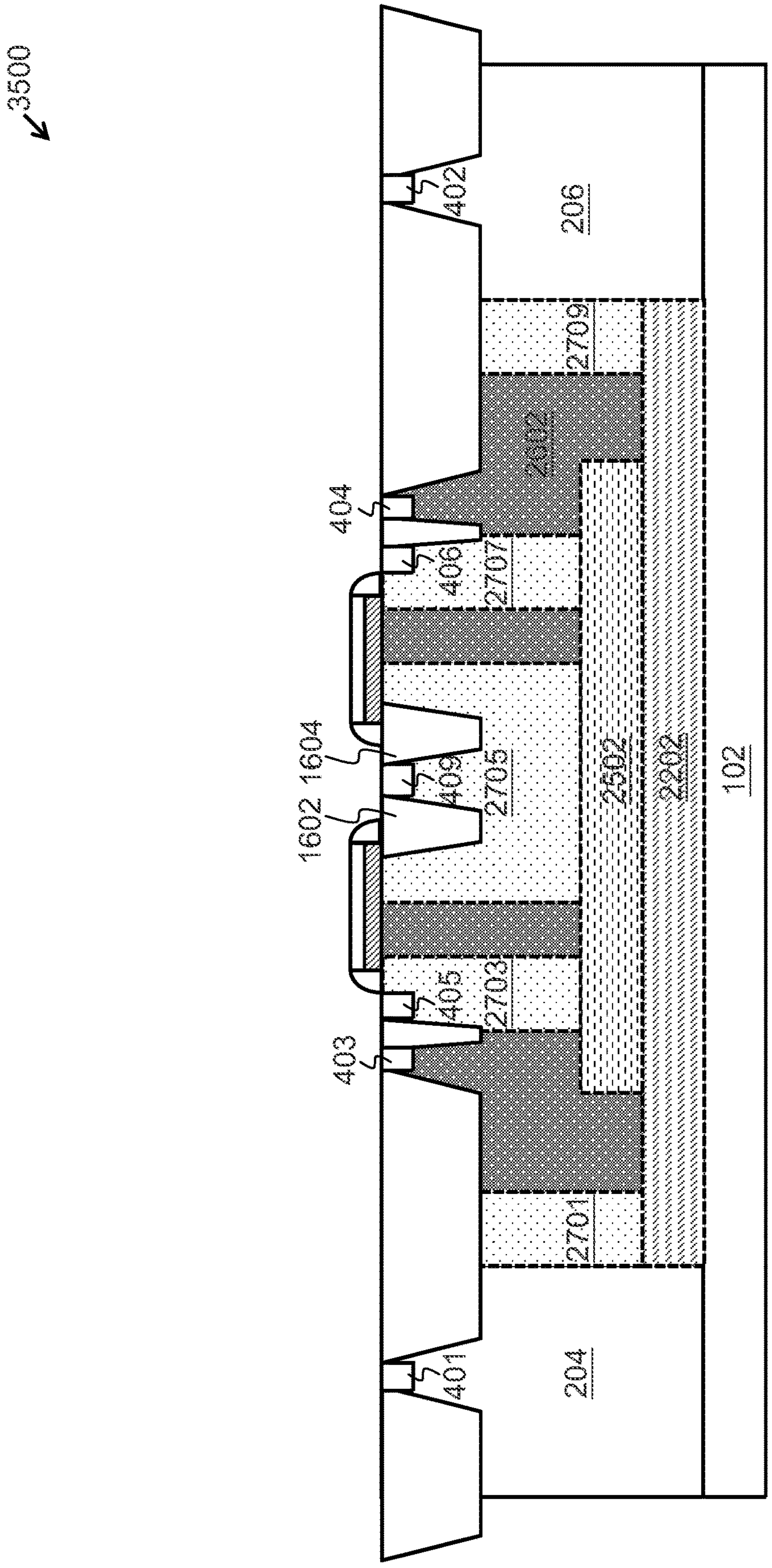
FIG. 35 illustrates a simplified cross-sectional view of yet another asymmetric n-type DMOS transistor in accordance with various embodiments of the present disclosure.

FIG. 35 illustrates a simplified cross-sectional view of yet another asymmetric n-type DMOS transistor in accordance with various embodiments of the present disclosure. The structure of the semiconductor device 3500 is similar to the structure of the semiconductor device 3300 except that two STI regions 1602 and 1604 are employed to extend the drain of the semiconductor device 3500. The operation principle of extended drain MOS transistors is well known, and hence is discussed in detail herein.

Figure 36:
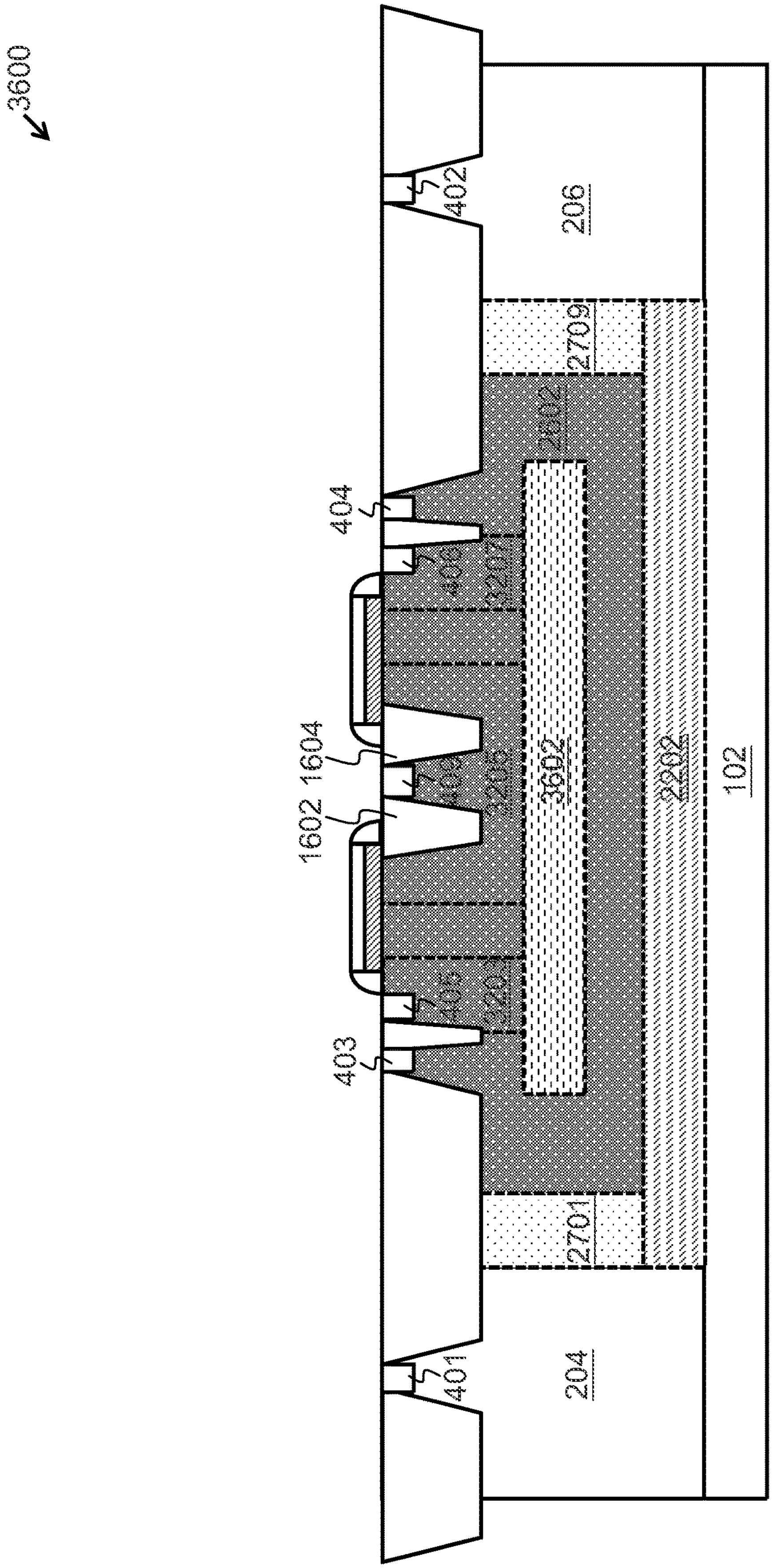
FIG. 36 illustrates a simplified cross-sectional view of yet another asymmetric n-type DMOS transistor in accordance with various embodiments of the present disclosure.

FIG. 36 illustrates a simplified cross-sectional view of yet another asymmetric n-type DMOS transistor in accordance with various embodiments of the present disclosure. The structure of the semiconductor device 3600 is similar to the structure of the semiconductor device 3400, and hence is not discussed in detail herein.

In accordance with an embodiment, a semiconductor device comprises an n-type buried layer over a substrate, a p-type buried layer over the n-type buried layer, a first well over the p-type buried layer, wherein sidewalls of the p-type buried layer are surrounded by the first well, a first high voltage n-type well extending through the first well, a second high voltage n-type well extending through the first well, a third high voltage n-type well extending through the first well, a first drain/source region in the first high voltage n-type well, a first gate electrode over the first well, a second drain/source region in the second high voltage n-type well and a first isolation region in the second high voltage n-type well, and between the second drain/source region and the first gate electrode.

In accordance with another embodiment, a device comprises a first buried layer over a substrate, a second buried layer over the first buried layer, a first well over the first buried layer and the second buried layer, a first high voltage well, a second high voltage well and a third high voltage well extending through the first well, wherein the second high voltage well is between the first high voltage well and the third high voltage well, a first drain/source region in the first high voltage well, a first gate electrode over the first well, a second drain/source region in the second high voltage well and a first isolation region in the second high voltage well, and between the second drain/source region and the first gate electrode, wherein a bottom of the first isolation region is lower than a bottom of the second drain/source region.

In accordance with yet another embodiment, an apparatus comprises a first buried layer over a substrate, a second buried layer over the first buried layer, a first well over the first buried layer and the second buried layer, a first high voltage well, a second high voltage well and a third high voltage well extending through the first well, wherein the second high voltage well is between the first high voltage well and the second high voltage well, a first drain/source region in the first high voltage well, a first gate electrode over the first well, a second drain/source region in the second high voltage well, a first isolation region in the second high voltage well, and between the second drain/source region and the first gate electrode, a third drain/source region in the third high voltage well, a second gate electrode formed over the first well and a second isolation region in the second high voltage well, and between the second drain/source region and the second gate electrode.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:

an n-type buried layer;

a first well over the n-type buried layer;

a p-type buried layer in the first well and over the n-type buried layer, wherein the p-type buried layer is spaced apart from the n-type buried layer;

a first high voltage n-type well extending into the first well;

a second high voltage n-type well extending into the first well;

a third high voltage n-type well extending into the first well, wherein the second high voltage n-type well is interposed between the first high voltage n-type well and the third high voltage n-type well;

a first drain/source region in the first high voltage n-type well;

a first gate electrode over the first well; and a second drain/source region in the second high voltage n-type well.

2. The semiconductor device of claim 1, wherein the first well extends between a bottom surface of the p-type buried layer and a top surface of the n-type buried layer.

3. The semiconductor device of claim 1, further comprising:

a spacer adjacent the first gate electrode, wherein the second drain/source region is laterally spaced apart from the spacer; and a dielectric layer extending over the spacer to the second drain/source region.

4. The semiconductor device of claim 3, wherein the dielectric layer only partially covers an upper surface of the first gate electrode.

5. The semiconductor device of claim 4, further comprising a well contact region in the first well.

6. The semiconductor device of claim 5, further comprising an isolation region interposed between the well contact region and the first drain/source region.

7. The semiconductor device of claim 6, wherein the isolation region overlaps a vertical interface between the first high voltage n-type well and the first well.

8. A semiconductor device comprising:

a first buried layer over a substrate;

a second buried layer over the first buried layer;

a first well over the first buried layer, the first well completely separating the first buried layer and the second buried layer;

a first high voltage well and a second high voltage well in the first well;

a first drain/source region in the first high voltage well;

a first gate electrode over the first well; and a second drain/source region in the second high voltage well.

9. The semiconductor device of claim 8, wherein the second buried layer extends laterally past the first high voltage well and the second high voltage well.

10. The semiconductor device of claim 9, wherein the first well extends laterally past the second buried layer.

11. The semiconductor device of claim 10, wherein the first buried layer extends laterally past the first well.

12. The semiconductor device of claim 8, further comprising:

a third high voltage well extending through the first well, wherein the third high voltage well is between the first high voltage well and the second high voltage well;

a second gate electrode over the first well, the second high voltage well and the third high voltage well; and a third drain/source region in the third high voltage well.

13. The semiconductor device of claim 8, further comprising an isolation structure extending along sidewalls of the first high voltage well.

14. The semiconductor device of claim 13, wherein the isolation structure further overlaps a boundary between the first high voltage well and the first well.

15. A semiconductor device comprising:

a first buried layer over a substrate;

a first well over the first buried layer;

a second buried layer over the first buried layer, wherein a first portion of the first well extends between the first buried layer and the second buried layer;

a first high voltage well, a second high voltage well, and a third high voltage well extending through the first well, wherein the second high voltage well is between the first high voltage well and the third high voltage well;

a first drain/source region in the first high voltage well;

a first gate electrode over the first well;

a second drain/source region in the second high voltage well;

a third drain/source region in the third high voltage well; and a second gate electrode formed over the first well.

16. The semiconductor device of claim 15, wherein a second portion of the first well extends between the first high voltage well and the second high voltage well, and wherein a third portion of the first well extends between the second high voltage well and the third high voltage well.

17. The semiconductor device of claim 15, wherein the first gate electrode extends from over the first high voltage well to over the second high voltage well, and wherein the second gate electrode extends from over the second high voltage well to over the third high voltage well.

18. The semiconductor device of claim 15, wherein the first high voltage well, the second high voltage well, and the third high voltage well each extends to the second buried layer.

19. The semiconductor device of claim 16, wherein the first portion of the first well fully separates the second buried layer from the first buried layer.

20. The semiconductor device of claim 16, wherein the first well extends laterally past opposing ends of the second buried layer.

* * * * *